United States Patent
Kumar et al.

(10) Patent No.: US 7,173,284 B2
(45) Date of Patent: Feb. 6, 2007

(54) SILICON CARBIDE SEMICONDUCTOR DEVICE AND MANUFACTURING METHOD

(75) Inventors: Rajesh Kumar, Kariya (JP); Tsuyoshi Yamamoto, Kariya (JP); Hiroki Nakamura, Kariya (JP)

(73) Assignee: Denso Corporation, Kariya (JP)

( * ) Notice: Subject to any disclaimer, the term of this patent is extended or adjusted under 35 U.S.C. 154(b) by 481 days.

(21) Appl. No.: 10/230,115

(22) Filed: Aug. 29, 2002

(65) Prior Publication Data

US 2003/0042491 A1    Mar. 6, 2003

(30) Foreign Application Priority Data

Aug. 29, 2001 (JP) .............................. 2001-260210
Jul. 25, 2002 (JP) .............................. 2002-216665

(51) Int. Cl.
*H01L 29/15* (2006.01)

(52) U.S. Cl. ........................ 257/77; 257/263; 257/268; 438/186; 438/931

(58) Field of Classification Search .................. 257/77, 257/78, 79, 80, 81, 82, 83, 84, 85, 88, 89; 438/22, 24, 46, 47, 105, 931
See application file for complete search history.

(56) References Cited

U.S. PATENT DOCUMENTS 5,323,040 A * 6/1994 Baliga ........................ 257/332
5,679,966 A * 10/1997 Baliga et al. ................ 257/139
5,742,076 A * 4/1998 Sridevan et al. .............. 257/77
5,753,938 A * 5/1998 Thapar et al. ................. 257/77
5,877,515 A * 3/1999 Ajit ............................. 257/76
6,096,607 A * 8/2000 Ueno ........................ 438/268
6,391,699 B1 * 5/2002 Madson et al. ............. 438/212
6,551,865 B2 * 4/2003 Kumar et al. .............. 438/137
6,600,192 B1 * 7/2003 Sugawara et al. .......... 257/329
6,627,499 B2 * 9/2003 Osawa ....................... 438/259
6,630,698 B1 * 10/2003 Deboy et al. ............... 257/285
6,693,314 B2 * 2/2004 Mitlehner et al. .......... 257/256
6,710,403 B2 * 3/2004 Sapp .......................... 257/330

FOREIGN PATENT DOCUMENTS

| JP | A-4-150073 | 5/1992 |
| JP | A-9-172187 | 6/1997 |
| JP | A-2000-31483 | 1/2000 |
| JP | A-2000-312008 | 11/2000 |

* cited by examiner

*Primary Examiner*—Sara Crane
(74) *Attorney, Agent, or Firm*—Posz Law Group, PLC

(57) ABSTRACT

A silicon carbide semiconductor device that includes J-FETs has a drift layer of epitaxially grown silicon carbide having a lower impurity concentration level than a substrate on which the drift layer is formed. Trenches are formed in the surface of the drift layer, and first gate areas are formed on inner walls of the trenches. Second gate areas are formed in isolation from the first gate areas. A source area is formed on channel areas, which are located between the first and second gate areas in the drift layer. A method of manufacturing the device ensures uniform channel layer quality, which allows the device to have a normally-off characteristic, small size, and a low likelihood of defects.

12 Claims, 17 Drawing Sheets

SILICON CARBIDE SEMICONDUCTOR DEVICE AND MANUFACTURING METHOD

CROSS REFERENCES TO RELATED APPLICATIONS

This application relates to and incorporates by reference Japanese patent application number 2001-260210, which was filed on Aug. 29, 2001, and Japanese patent application number 2002-216665, which was filed on Jul. 25, 2002.

BACKGROUND OF THE INVENTION

The present invention relates to a silicon carbide semiconductor device, having J-FETs, and a manufacturing method.

Such a silicon carbide semiconductor device, having J-FETs, is provided in, for example, an unexamined patent publication H2000-312008. A cross-sectional view of an n-channel J-FET, provided in this publication, is shown in FIG. 33. As shown in this figure, the n-channel J-FET is formed using a substrate consisting of an n$^-$-type drift layer J2 grown on an n$^+$-type substrate J1, which consists of SiC. A p-type first gate area J3 is formed on the surface of the n$^-$-type epi-layer J2. A trench J4, penetrating the first gate area J3 and reaching the n$^-$-type drift layer J2, is then formed.

An n$^-$-type channel layer J5 is grown epitaxially on a surface of the first gate area J3 as well inside the trench J4. A p-type second gate area J6 is then formed on a surface of the n$^-$-type channel layer J5 inside the trench J4. Furthermore, n$^+$-type source areas J7 are formed in the n$^-$-type channel layer J5 at areas that are not located between the first and second gate areas J3 and J6.

Furthermore, source electrodes J9, which are electrically connected to the n$^+$-type source areas J7, and a gate electrode J8, which is electrically connected to the first and second gate areas J3, J6, are provided. Finally, a drain electrode J10 is provided on a backside of the n$^+$-type substrate J1 to complete the J-FET shown in FIG. 22.

In this J-FET, a voltage being applied to the gate electrode J8 is controlled for controlling the distance over which a depletion layer extends through the n$^-$-type channel layer J5 and for forming a channel, so that current flows between the sources and the drain through the channel.

In the J-FET described above, the n$^-$-type channel layer J5 is grown epitaxially inside the trench J4. Say that a bottom surface of the trench J4 is surface a, and side walls are surfaces c. The rates of epitaxial growth differ between the surface a and the surfaces c, and the quality of the n$^-$-type channel layer J5 would be different between the film formed on the bottom surface of the trench J4 and on the side walls. More specifically, the amounts of impurity doping in the n$^-$-type channel layer J5 can vary by an order magnitude between different areas.

Although epitaxial growth is less susceptible to crystal defects compared with ion implanting, crystal defects, nevertheless, are created because the epitaxial growth takes place inside the trench J4.

When the n$^-$-type channel layer J5, which is used as a channel, has inconsistent levels of impurity doping and has crystal defects, electrical characteristics of the currents flowing through the channel can be inconsistent. Therefore, it is difficult to form J-FET devices with uniform quality levels.

As provided in the unexamined patent publication H9-172187 and 2000-31483, a silicon carbide semiconductor device that addresses this problem may be formed by using the drift layer as the channel area to ensure uniform quality.

A silicon carbide semiconductor device provided in the unexamined patent publication H9-172187 is shown in FIG. 34. The reference numerals in FIG. 33 are used again in FIG. 34 for the like parts. In this semiconductor device, a multitude of trenches J4 are formed at the surface of the n$^-$-type drift layer J2, and a p-type epitaxial film J11 is formed on inner side walls of the trenches J4. An n-type source area J12 is formed on the surface of the drift layer J2, excluding the areas where the trenches J4 are formed. The channel area J13 is an area beneath this source area J12. In this semiconductor device, the channel area J13 is located between pn junctions found between the channel area J13 and the epitaxial film J11.

The n$^-$-type drift layer J2 is formed by an epitaxial growth method, and the drift layer J2 is used as the channel area J13 in the structure described above. For this reason, uniform quality is ensured with this J-FET.

In J-FET devices used in automotive applications, currents flowing through the source and the drain should be turned off when a bias on the gate is turned off, or the device should have a normally-off characteristic. Such a normally-off characteristic is obtained if depletion layers extend into the channel area from the pn junctions between the channel area J13 and the p-type epitaxial film J11 and pinch off the channel area when a bias is not applied to the gate. Therefore, the smaller the width of the channel area, the easier it is for the depletion layers from both sides of the channel area to reach one another and pinch off the channel area.

In the silicon carbide semiconductor device shown in FIG. 34, however, the width of the channel is determined by the distance between the adjacent trenches at the surface of the drift layer J2. Therefore, the width of the channel area is determined by the width of the area left behind on the drift layer J2 after the trenches are etched.

Normally, the width of the channel area should be slightly less than one micron in order to ensure a pinch off by the depletion layers. It is difficult, however, to achieve sub-micron spacing between adjacent trenches with trench etching technology. Process non-uniformity becomes significant when trenches are etched with sub-micron spacing in between, making it difficult to obtain J-FET devices with normally-off characteristics.

A silicon carbide semiconductor device provided in the unexamined patent publication 2000-31483 is shown in FIG. 35. In this semiconductor device, a first gate area J20 is formed by ion implanting on an area where trenches J4 are not formed on a drift layer J2, or an area left behind by a trench etching process.

Gate electrodes J22 are formed on inner walls of trenches J4 on top of an insulating film J21 formed with, for example, an oxide film. In other words, MOS structures, consisting of the drift layer J2, the insulating film J21a, and the gate electrodes J22, are formed near side walls of the trenches J4. Out of the drift layer J2, areas between the first gate area J20 and the side walls of the trenches J4 become channel areas J23. Therefore, the drift layer J2 is used as the channel areas J23. For this reason, uniform quality is ensured with the J-FET devices.

Furthermore, second gate areas J24 are formed in the drift layer J2 at areas facing bottom surfaces of the trenches J4. This semiconductor device has junctions between the first gate area J20 and the insulating film J21a and junctions between the first gate area J20 and the second gate areas J24.

When a bias is not applied to the gates, depletion layers extend from pn junctions between the first gate area J20 into the channel areas J23, and depletion layers also extend out from the insulating films J21a into the channel areas J23. As a result, the channel areas J23 get pinched off.

As mentioned earlier, the widths of the channel areas J23 in this semiconductor device is adjusted by forming the first gate area J20 by ion implanting. However, when the semiconductor device, having the structure described above, is manufactured, the widths of the channel areas become non-uniform, making it difficult to ensure a normally-off characteristic with the semiconductor device.

Even if the resulting semiconductor device were to offer a normally-off characteristic, the device faces another problem. When a bias is applied to the gates, or when the device is turned on, the depletion layers that are pinching off the channel areas J23 become smaller, and currents flow between the source and the drain. Because a voltage is applied on the oxide film, the depletion layers extending from the MOS structure into the channel areas J23 do not show much change, and only the depletion layers extending from the pn junctions become smaller. In other words, only the size of the depletion layers extending from the pn junctions is controlled, and the channels remain narrow even when the device is turned on. As a result, resistance is large.

In the structures shown in FIG. 34 and FIG. 35, the source electrodes J9 and the gate electrodes J8, J22 are formed in the cell area. Contact areas are required for the source electrodes J9 and the gate electrodes J8, J22 on the surfaces of the semiconductor substrate. Furthermore, an insulating area J21b is required for isolating the source electrode J9 and the gate electrode J22, especially in the structure shown in FIG. 24, in which the source electrode J9 and the gate electrode J22 are formed adjacently.

Furthermore, because the trenches J4 are formed on the surface of the semiconductor substrate in the structures shown in FIG. 34 and FIG. 35, steps are formed at the surface. For this reason, it is difficult to ensure good wire bonding characteristics, when wires are bonded on these devices for external contacts. The gate electrode J22 is especially susceptible to open failures at the steps J25 in the structure shown in FIG. 35.

SUMMARY OF THE INVENTION

The present invention addresses the problems described above by providing a silicon carbide semiconductor device, having J-FETs, and a manufacturing method that ensure uniform quality of a channel layer and making it easier to offer a normally-off characteristic.

The present invention also provides a silicon carbide semiconductor device and a method of manufacturing that makes the cell size smaller.

In addition, the present invention provides a silicon carbide semiconductor device and a method of manufacturing that minimizes failures caused by steps that exist on the surface of a substrate.

To achieve these objectives, the invention is a J-FET having a semiconductor substrate, which includes a substrate 1 of a first conductivity type made of silicon carbide, and a drift layer 2 of the first conductivity type made of silicon carbide, grown epitaxially on the substrate 1 and having a lower impurity concentration than the substrate 1; trenches 3 formed at the surface of the drift layer 2; first gate areas 4 of a second conductivity type formed on inner walls of the trenches 3; a second gate area 5 of the second conductivity type formed at the surface of the drift layer 2 in isolation from the first gate areas 4 at an area different from where the trenches 3 are formed and having a depth similar to the trenches 3; channel areas 6 in the drift layer 2 at areas sandwiched between the first and second gate areas 4, 5; a source area 7 of the first conductivity type formed on top of the channel areas and having a higher impurity concentration than the drift layer 2; a first gate electrode 12 electrically connected to the first gate area 4; a second gate electrode 12 electrically connected to the second gate area 5; a source electrode 9 electrically connected to the source area 7; and a drain electrode 10 formed on a backside of the substrate 1.

DETAILED DESCRIPTION OF THE PREFERRED EMBODIMENTS

First Embodiment

Figure 1:
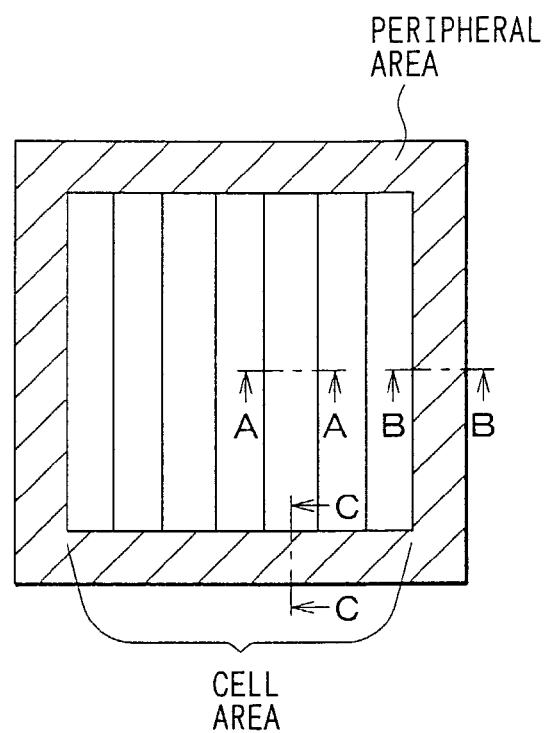
FIG. 1 is a diagrammatic plan view of the silicon carbide semiconductor device of the first embodiment of the present invention.
Figure 2:
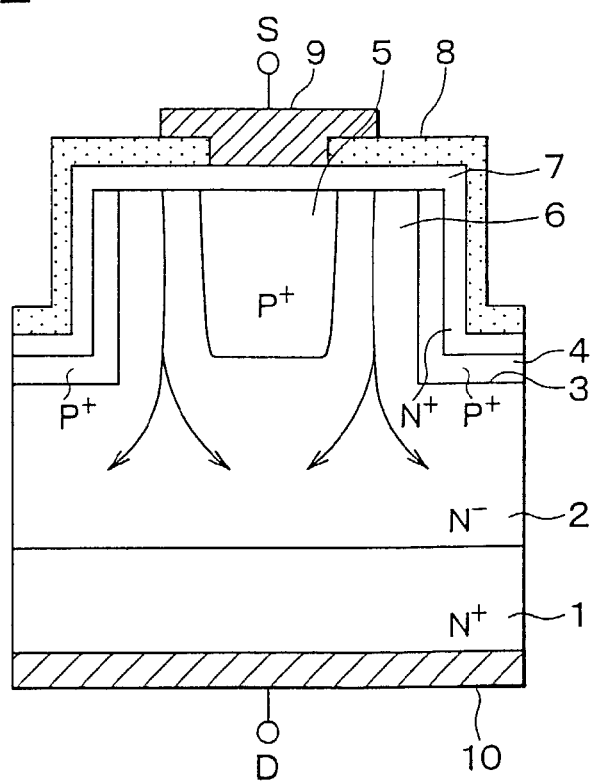
FIG. 2 is a cross-sectional view of the silicon carbide semiconductor device of FIG. 1 taken along line A—A in FIG. 1.
Figure 3:
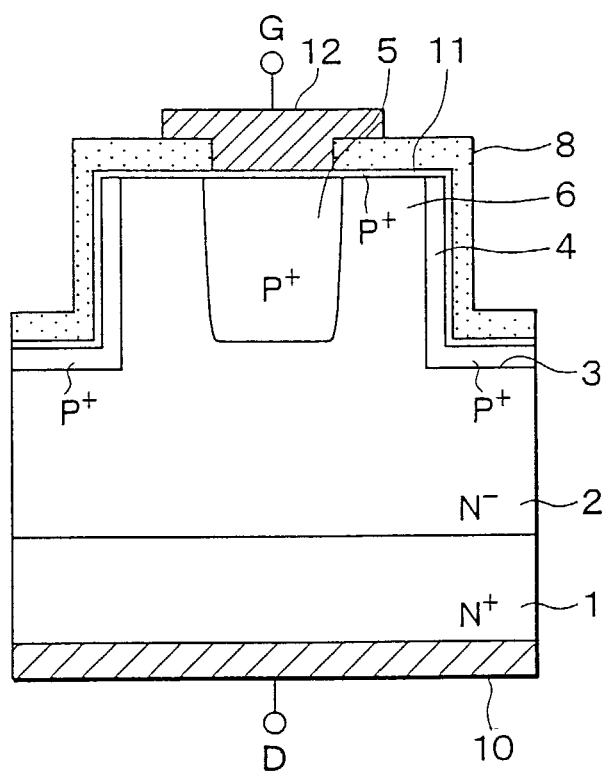
FIG. 3 is a cross-sectional view of the silicon carbide semiconductor device of FIG. 1 taken along line B—B in FIG. 1.
Figure 4:
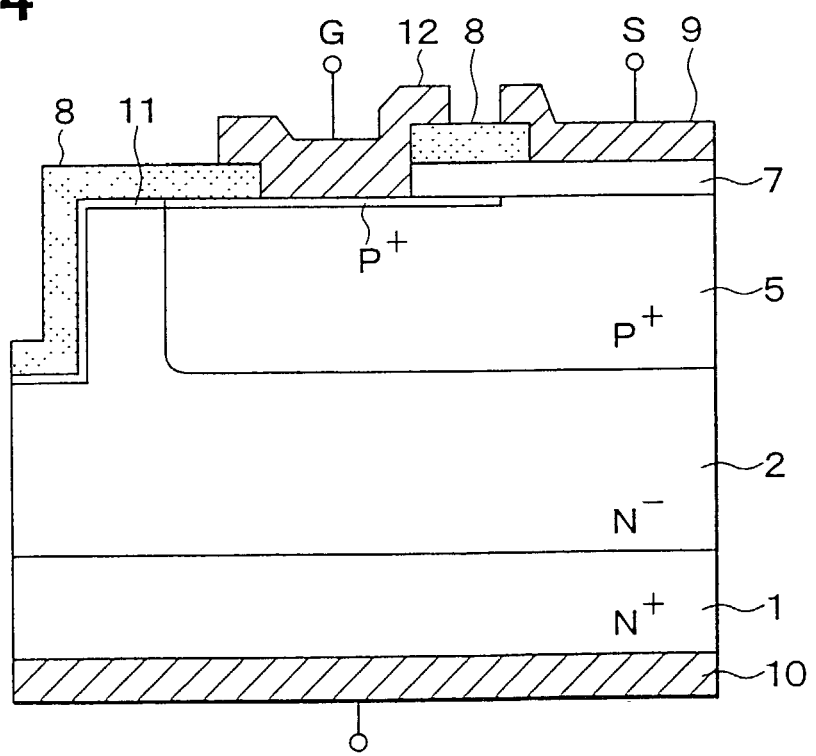
FIG. 4 is a cross-sectional view of the silicon carbide semiconductor device of FIG. 1 taken along line C—C in FIG. 1.

FIG. 1 shows a cell area, or section, and a peripheral area surrounding the cell area. FIG. 2 shows a cross-sectional view along a line A—A of FIG. 1, which is in the cell area, and FIG. 3 and FIG. 4 show cross-sectional views along lines B—B and C—C of FIG. 1, respectively, which are in a peripheral area.

As shown in FIG. 1, in the silicon carbide semiconductor device, a cell that makes up a J-FET is formed in stripes in the cell area. The peripheral area is an area in which no transistor is formed.

Specifically, as shown in FIG. 2, a semiconductor substrate, that includes an n$^+$-type substrate 1 having an impurity concentration level of more than or equal to 1E19/cm$^3$, and an n$^-$-type drift layer 2, having an impurity concentration level of, for example, 1E15/cm$^3$ to 5E16/cm$^3$, is used.

A multitude of trenches 3 are formed in isolation from each other at a surface of the n$^-$-type drift layer 2 in the cell area. The trenches 3 have side walls that form 60 degree to 90 degree angles with respect to a bottom surface. First gate areas 4, which are made of a p$^+$-type layer, are grown epitaxially on the surfaces of the inner walls of the trenches 3. A second gate area 5, which is made of a p$^+$-type layer, is formed in an area of the n$^-$-type drift layer 2 between the first gate areas 4. The second gate area 5 has a depth comparable to the first gate areas 4 and terminates at a surface of the n$^-$-type drift layer 2. The first and second gate areas 4, 5 have impurity concentration levels of, for example, 5E17/cm$^3$ to 5E19/cm$^3$.

Areas between the first and second gate areas 4, 5 in the n$^{31}$-type drift layer 2 are channel areas 6. An n$^+$-type source area 7 is grown epitaxially at the surface of the first and second gate areas 4, 5 and at the surface of the channel areas 6. The n$^+$-type source area 7 has an impurity concentration level of, for example, 1E18/cm$^3$ to 5E19/cm$^3$.

A source electrode 9, electrically connected to the n$^+$-type source area 7 through a contact hole in an interlayer insulating film 8, is formed at the surface of the n$^+$-type source area 7. The source electrode 9 is made of a material like Ni, which is capable of establishing an Ohmic contact with an n-type area. A drain electrode 10 is formed on the backside of the n$^+$-type substrate 1 to complete the structure shown in FIG. 2.

As shown in FIG. 3 and FIG. 4, the peripheral area of the cell basically has the same structure as the cell area, except that the peripheral area does not include the n$^+$-type source area 7 and the source electrode 9, which are included in the cell area. Instead, the peripheral area includes a p$^+$-type layer 11 an area having a second conductivity type on the surface of the first and second gate areas 4, 5 and the n$^-$-type drift layer 2. Gate electrodes 12 are formed on the surface of the p$^+$-type layer 11. The gate electrodes 12 are electrically connected to the p-type layer 11 through contact holes in the interlayer insulating film 8 and are made of Al or Ti in order to form Ohmic contact with the p-type area. As thus described, the peripheral area has a structure that facilitates electrical contact between the first and second gate areas 4, 5 and the gate electrodes 12, as shown in FIG. 3 and FIG. 4.

Figure 34:
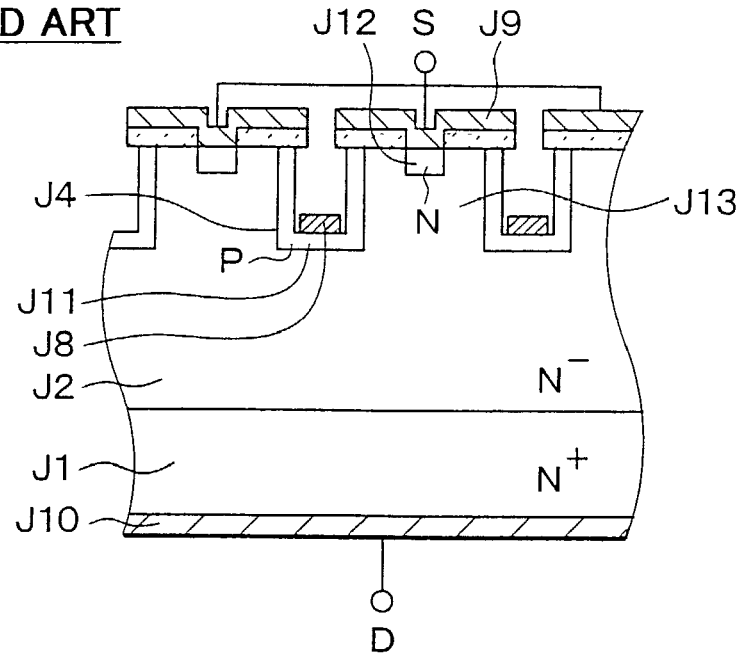
FIG. 34 is a cross-sectional diagram showing a second example of a prior silicon carbide semiconductor device.
Figure 35:
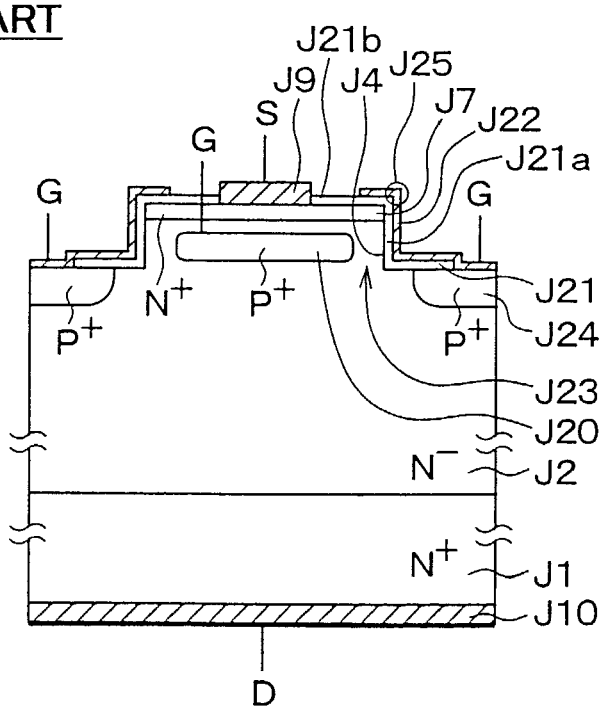
FIG. 35 is a cross-sectional diagram showing a third example of a prior silicon carbide semiconductor device.

In the present embodiment, the source electrode 9 is only formed in the cell area, while the gate electrodes 12 are only formed in the peripheral area. As shown in FIG. 34 and FIG. 35, a device structure having the gate electrodes formed in the cell area would require contact areas for the gate electrodes at the surface of the semiconductor substrate in the cell area. On the other hand, because the gate electrodes are not formed in the cell area in the present embodiment, contact areas for the gate electrodes are not required in the cell area. Furthermore, as shown in FIG. 35, a structure having a gate electrode and the source electrode next to each other would require areas for forming the insulating film 21 for isolating the gate electrode and the source electrode. The present embodiment, however, does not require such an area for insulation. For this reason, the present embodiment offers a smaller cell size compared with the structure in which the gate electrodes are formed in the cell area.

The J-FET having this structure operates in a normally-off mode. More specifically, the device is double-gate driven, in which the lengths of the depletion layers, which extend into the channel areas 6 from both the first and second gate areas 4, 5, are controlled by a voltage applied on the gate electrodes 12. For example, when a voltage bias is not applied on the gate electrodes 12, the channel areas 6 are pinched off by the depletion layers extending from the first and second gate areas 4, 5. Currents between the source and drain areas are thus shut off. When a forward bias is applied between the first and second gate areas 4, 5 and the channel area 6, the depletion layers in the channel areas 6 become shorter. As a result, carriers flow through.

Next, a method of manufacturing the silicon carbide semiconductor device, shown in FIG. 1 through FIG. 4, is explained by referring to manufacturing stages of the silicon carbide semiconductor device of FIGS. 5 to 11. Because the cell area and the peripheral area are manufactured with almost identical process steps, FIGS. 5 to 9 show parts of the process that are common to both the cell area and the peripheral area.

Figure 5:
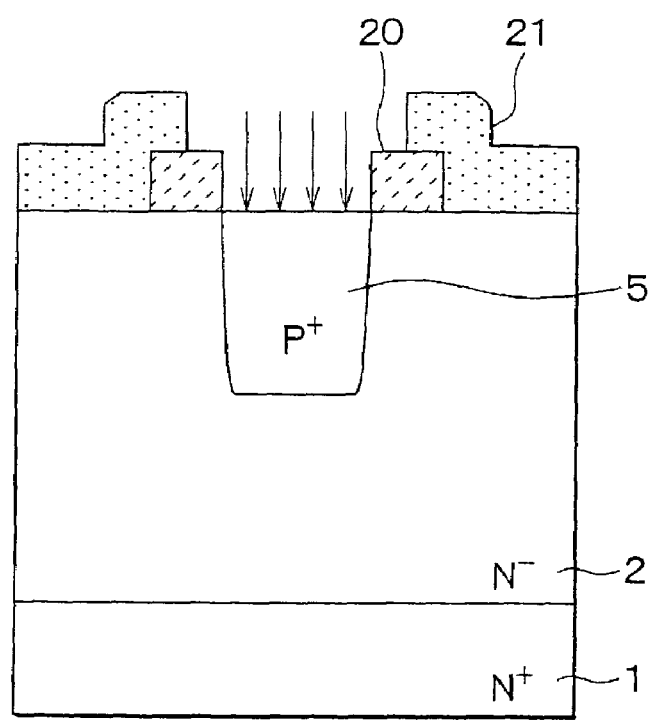
FIG. 5 is a cross-sectional diagram showing a manufacturing stage of the silicon carbide semiconductor device in FIGS. 1 to 4.

Steps Shown in FIG. 5

On an $n^+$-type substrate 1, channels are set up, and an $n^-$-type drift layer 2 is deposited on the surface between the source and drain, as shown by arrows in FIG. 5. A polysilicon film first mask material 20 is deposited on the surface of the $n^-$-type drift layer 2, and openings, which correspond to second gate areas 5 and trenches 3, are made in the polysilicon film 20 by photolithography. Next, an LTO film (second mask material) 21 is deposited on the surface of the substrate. An opening corresponding to the second gate area 5 is made in the LTO film 21 by photolithography. In other words, the LTO film 21 covers the openings in the polysilicon film 20 corresponding to the trenches 3.

The widths of the openings in the LTO film 21 are greater than the widths of the openings in the polysilicon film 20. In this way, mask misalignments during the photolithography steps would not prevent the opening for the second gate area 5 from being formed.

Using the polysilicon film 20 and the LTO film 21 as a mask, p-type impurities (for example, B or Al) are ion implanted to form the $p^+$-type second gate area 5. The edges of the second gate area 5 are defined by the edges of the openings in the polysilicon film 20.

Figure 6:
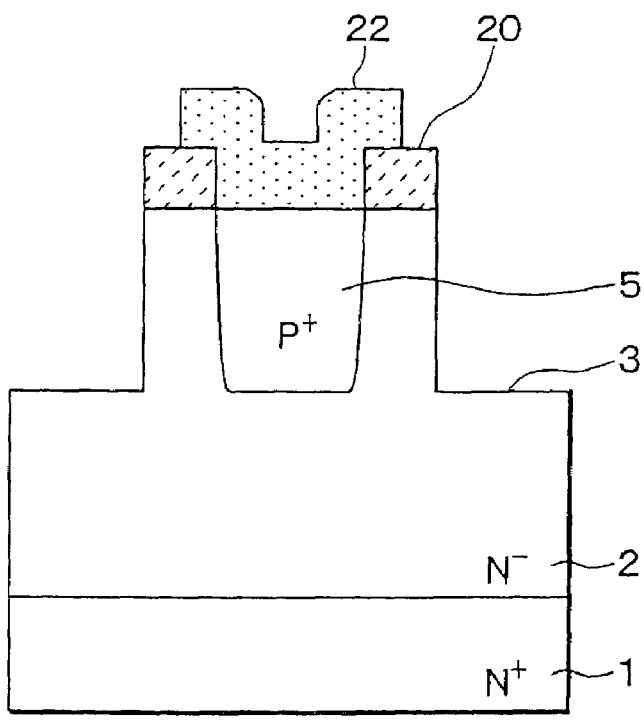
FIG. 6 is a cross-sectional diagram showing a manufacturing stage of the silicon carbide semiconductor device subsequent to that of FIG. 5.

Steps shown in FIG. 6

After the LTO film 21 is stripped off, another LTO film (third mask material) 22 is deposited. Openings corresponding to the trenches 3 are made in the LTO film 22 by photolithography. In other words, the LTO film 22 covers the opening in the polysilicon film 20 that corresponds to the second gate area 5.

Again, the widths of the openings in the LTO film 22 are designed to be larger than the widths of the openings in the polysilicon film 20, so that mask misalignments during the photolithography steps would not prevent the openings corresponding to the trenches 3 from being formed.

Using the polysilicon film 20 and the LTO film 22 as a mask, an etching process is performed for forming the trenches 3. For example, an RIE process using $CF_4$ may be used. The edges of the trenches 3 are defined by the edges of the openings in the polysilicon film 20. Therefore, both the edges of the second gate area 5 and the edges of the trenches 3 are defined by the edges of the openings in the polysilicon film 20. Because the second gate area 5 and the trenches 3 are formed based on patterns in the polysilicon film 20, which are formed using a single mask, the second gate area 5 and the trenches 3 are formed in a self-aligned manner, with equal spacing in between.

Although the steps shown in FIG. 6 are shown to take place after the steps shown in FIG. 5 in this particular example, the order of these steps may be reversed.

Figure 7:
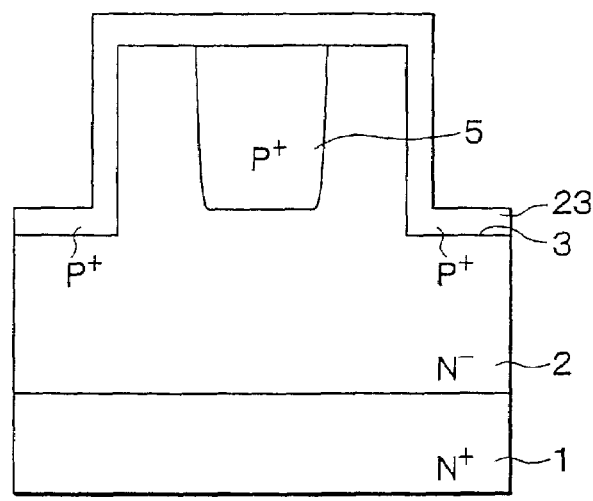
FIG. 7 is a cross-sectional diagram showing a manufacturing stage of the silicon carbide semiconductor device subsequent to that of FIG. 6.

Steps shown in FIG. 7

After the polysilicon film 20 and the LTO film 22 are stripped off, a $p^+$-type layer 23 is deposited on the substrate surface, as well as on the inner walls of the trenches 3.

Figure 8:
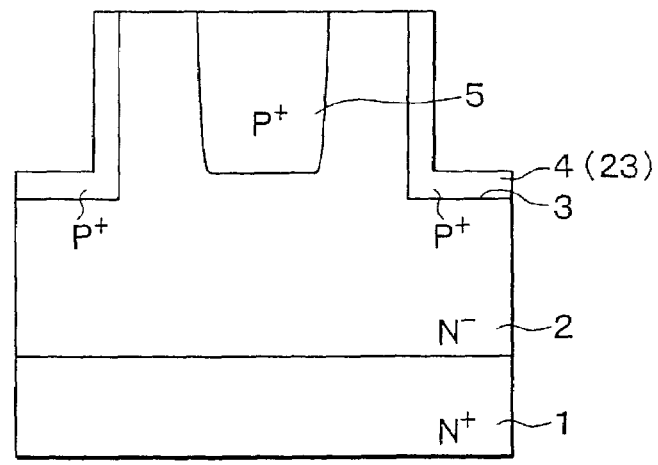
FIG. 8 is a cross-sectional diagram showing a manufacturing stage of the silicon carbide semiconductor device subsequent to that of FIG. 7.

Steps shown in FIG. 8

Using a chemical mechanical polishing (CMP) process, the top-most part of the $p^+$-type layer 23 is removed, to expose the second gate area 5 and the $n^-$-type drift layer 2. As a result, the $p^+$-type layer 23 would only remain on the surfaces of the inner walls of the trenches 3, and the first gate areas 4, as well as the channel areas 6 between the first and second gate areas 4, 5, are formed by the $p^+$-type layer 23.

As described above, because the trenches 3 and the second gate area 5 are formed in a self-aligned manner, the first and second gate areas 4, 5 have equal spacing, and the channel areas 6 have equal widths.

Although the second gate area 5 is formed by an ion implanting method in this particular example, it is also possible to obtain equal spacing between the trenches 3 and the second gate area 5 in a self-aligned manner, even when the second gate area 5 is formed by an epitaxial growth method.

More specifically, in the steps shown in FIG. 5, a trench is formed in the area for the second gate area 5, instead of ion implanting for forming the second gate area 5. During the steps shown in FIG. 6, the LTO film 22 is formed on top of the polysilicon film 20 as well as inside the trenches. Then, as shown in FIG. 6, an etching step is performed using the polysilicon film 20 and the LTO film 22 as a mask to form the trenches 3.

Then, during the steps shown in FIG. 7, the second gate area 5 is formed by an epitaxial growth inside the trench for the second gate area 5, after the polysilicon film 20 and the LTO film 22 are stripped off. Then, the $p^+$-type layer 23 is deposited across the substrate surface as well as the inner walls of the trenches 3. The state shown in FIG. 8 then follows.

Figure 9:
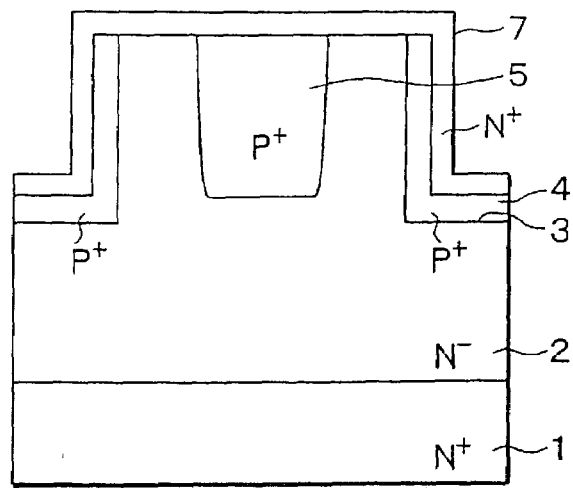
FIG. 9 is a cross-sectional view showing a manufacturing stage of the silicon carbide semiconductor device subsequent to that of FIG. 8.
Figure 10:
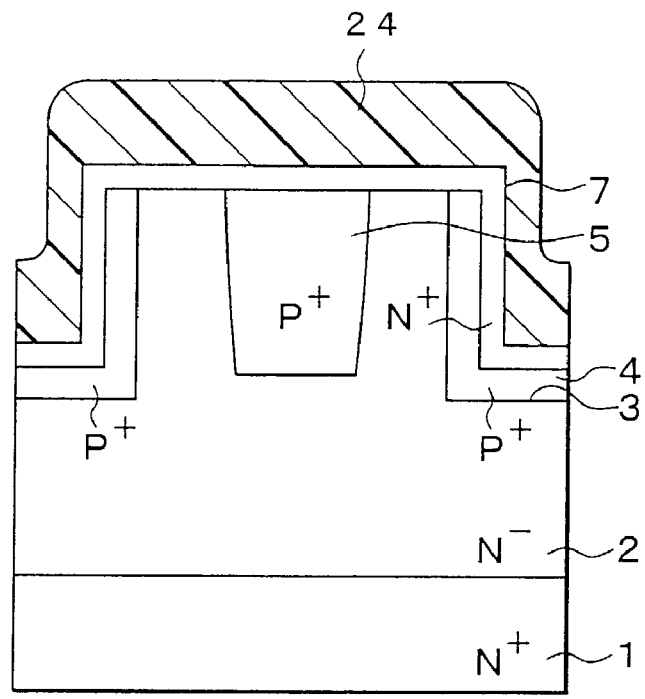
FIG. 10 is a cross-sectional view taken along line A—A of FIG. 1 showing a manufacturing stage of the silicon carbide semiconductor device subsequent to that of FIG. 9.

Steps shown in FIG. 9 and FIG. 10

As shown in FIG. 9, an $n^-$-type source area 7 is formed across the entire surface of the substrate. The $n^-$-type source area 7 may be formed by either an epitaxial growth method for forming an epitaxial film across the entire substrate surface or by an ion implanting method for forming an impurity diffusion area across the entire substrate surface.

Figure 11:
FIG. 11 is a cross-sectional view taken along line B—B of FIG. 1 showing a manufacturing stage of the silicon carbide semiconductor device subsequent to that of FIG. 9.
Figure 11:
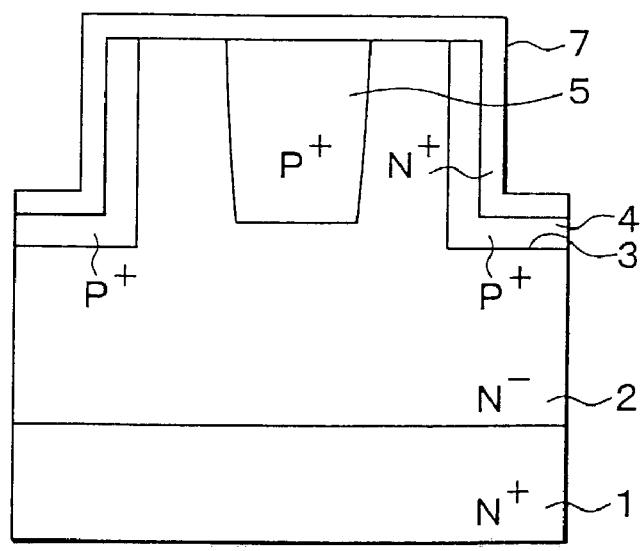

As shown in FIG. 10, a mask 24, which is made of a resist material or a silicon oxide film and covering the cell area, is formed on top of the n-type source area 7. As shown in FIG. 11, a part of the $n^-$-type source area 7, corresponding to the peripheral area, is selectively etched. The steps that follow are not shown in the diagrams. The mask 24 is also used for ion implanting p-type impurities (for example, B or Al) to form a $p^+$-type layer 11 in the peripheral area. Then, an interlayer insulating film 8 is formed on the surface of the $n^-$-type source area 7 and the $p^+$-type layer 11, and contact holes are formed in the interlayer insulating film 8. Next, a metallic film is formed, and the metallic film is patterned to form the source electrode 9 and the gate electrodes 12. Then, a drain electrode 10 is formed on the backside of the $n^+$-type substrate 1, followed by a sintering step to complete the silicon carbide semiconductor device having J-FETs as shown in FIG. 1 through FIG. 4.

The conventional semiconductor device having the structure shown in FIG. 35 required steps for forming two junctions between the first gate area J20 and the second gate areas J24 and between the first gate area J20 and the insulating film J21a on the side walls of the trenches J4, as well as the gate electrodes J22.

On the other hand, only one type of junctions is formed in the manufacturing steps for the semiconductor device of the present embodiment. For this reason, a fewer number of steps is required for manufacturing. More specifically, out of the steps required for manufacturing the semiconductor device having the structure shown in FIG. 35, the steps for forming the insulating film Ji1a on the side walls of the trenches J4 can be eliminated.

As explained thus far, the channel areas 6 are formed using the n⁻-type drift layer 2 in the silicon carbide semiconductor device of the present embodiment. Because the n⁻-type drift layer 2 is formed by an epitaxial growth on the top surface of the n⁺-type substrate 1, impurity concentration is uniform, and the defect level in the crystal is low. Compared with the conventional device, the channel areas of which are formed by an epitaxially grown film inside the trenches, the present embodiment provides the channel areas 6 with quality levels and electrical characteristics that are uniform. The resulting silicon carbide semiconductor device has the J-FETs with uniform quality levels.

Furthermore, in the present embodiment, the first gate areas 4 are formed along the inner walls of the trenches 3, and the second gate area 5 of the second conductivity type, having a depth comparable to the trenches 3, is formed in an area that is different from the areas where the trenches 3 are formed and in isolation from the first gate areas 4. The areas in the drift layer 2 that are sandwiched between the first and second gate areas 4, 5 become the channel areas 6, and the channel areas 6 have on both sides the pn junctions between the channel areas 6 and the first and second gate areas 4, 5.

With this structure, it is possible to have the two gate areas face each other across the depths of the trenches. Furthermore, it is possible to pinch off the channel areas 6 by taking advantage of the depletion layers that stretch out from the two pn junctions, when no bias is applied on the gates.

Because the second gate area 5 is formed by ion implanting, it is possible to control the position of the second gate area 5 and achieve narrow spacing between the first gate areas 4 and the second gate area 5. In other words, compared with the example in FIG. 34, in which the width of the channel areas are determined by the trench etching process, it is easier to control the widths of the channel areas 6 to ensure a normally-off characteristic, because the second gate area 5 is formed by ion implanting.

Furthermore, the first and second gate areas 4, 5 are formed in a self-aligned manner, and the width of each channel area 6 is uniform. For this reason, the quality of the channel areas 6 is more uniform, and quality of the silicon carbide semiconductor device, having J-FETs, is also more uniform. It is also possible to control the widths of the channel areas 6 more precisely in order to ensure a normally-off characteristic, as the first and second gate areas 4, 5 are formed. Therefore, a higher process uniformity is ensured compared with when the first and second gate areas are not formed in a self-aligned manner.

As a result of these improvements, it is possible to ensure a normally-off characteristic in the silicon carbide semiconductor device.

In the semiconductor device of the present embodiment, the two gate areas face each other across the depths of the trenches. Resistance to a voltage stress between the drain and source is determined by the pinch-off depletion layer, when no bias is applied on the gate. Because the widths of the depletion layers are at least comparable to the widths of the trenches, a higher resistance to voltage stress is achieved between the drain and the source.

Second Embodiment

Figure 12:
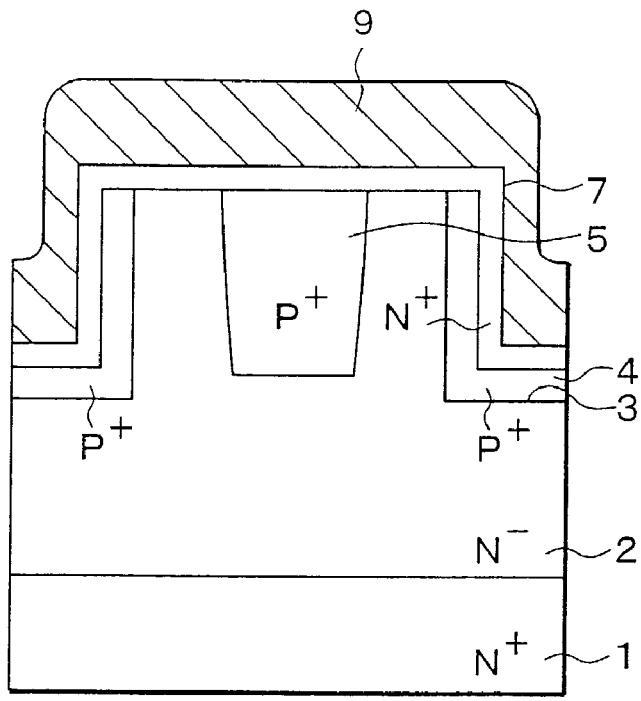
FIG. 12 is a cross-sectional view of the silicon carbide semiconductor device of a second embodiment of the present invention taken along line A—A of FIG. 1.

FIG. 12 shows a cross-section of a silicon carbide semiconductor device of the present embodiment. This figure corresponds to a cross-section taken along the line A—A in FIG. 2. Unlike the device structure in the first embodiment, in the present embodiment the interlayer insulating film 8 is not formed in the cell area, and the source electrode 9 is formed across the entire substrate surface. Same reference numerals as the FIG. 2 are used for the same parts in this drawing.

In the structure shown in FIG. 2, the source area 7 is formed across the entire substrate surface in the cell area. Contact holes are formed at positions above the second gate area 5 in the interlayer insulating film 8 above the source area 7. The source electrode 9 is electrically connected to the source area 7 through the contact hole. In other words, in the first embodiment, the source electrode 9 and the source area 7 come into contact with each other only at a part of the substrate surface.

On the other hand, in the present embodiment, as shown in FIG. 12, the interlayer insulating film 8 is not formed in the cell area, and a source electrode 9 is formed across the entire substrate surface. As a result, the source electrode 9 and the source area 7 are in contact across the entire cell area. As a result, source resistance is lower compared with the device structure in FIG. 2, in which the source electrode 9 and the source area 7 are in contact only at a part of the substrate surface.

Another structure is also possible, in which the source electrode 9 and the source area 7 are formed across an area covering at least the channel areas 6 and the side walls of the trenches 3, and the source electrode 9 and the source area 7 are in contact at least in the area covering the channel areas 6 and the side walls of trenches 3. Even with this structure, it is also possible to reduce the source resistance compared with the example in FIG. 2, in which the area, across which the source electrode 9 and the source area 7 are in contact, covers only a part of the substrate surface.

A method of manufacturing this silicon carbide semiconductor device is similar to the first embodiment, except that the interlayer insulating film 8 is not formed in the cell area during the steps for forming the interlayer insulating film. Or, after the interlayer insulating film 8 is deposited in the cell area, a contact hole, at least large enough for the source electrode 9 to be electrically connected to the source area 7 at least across an area over the channel areas 6 and the side walls of the trenches 3, is formed. Such a process would also provide the silicon carbide semiconductor device having the structure shown in FIG. 12.

Figure 13:
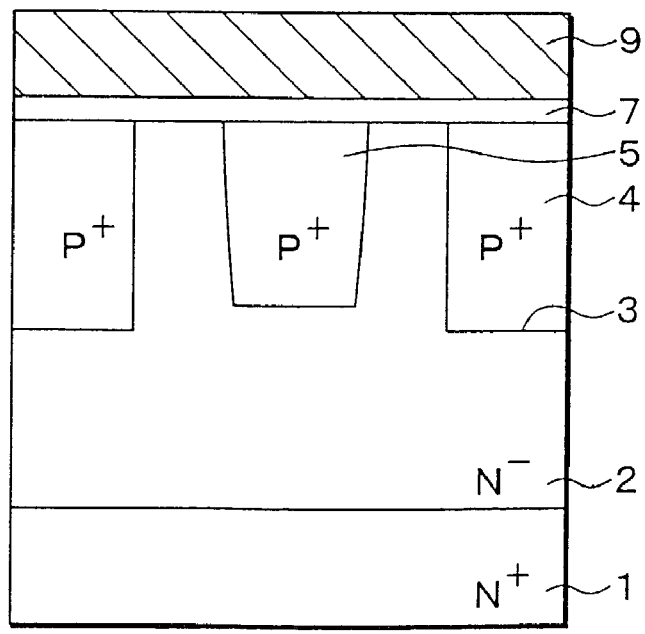
FIG. 13 is a cross-sectional view of the silicon carbide semiconductor device of the second embodiment of the present invention.

FIG. 13 shows a cross-section of a silicon carbide semiconductor device of another example. The surface of the semiconductor substrate is planarized by filling the trenches 3, in the structure shown in FIG. 12, with first semiconductor areas 4, which are formed by an epitaxial growth method.

If the trenches 3 are not completely filled by the first gate areas 4, steps would be created on the surface of the semiconductor substrate, which could cause bonding failures, as the electrodes get wire bonded for external contacts. On the other hand, the trenches 3 are filled with the first gate areas 4 in the present embodiment, ensuring planarization across the entire surface of the semiconductor substrate. As a result, wire bonding would be accomplished more successfully. In other words, product failures, caused by steps on the substrate surface, would be prevented.

Because the trenches 3 are filled by the first gate areas 4 in the structure shown in FIG. 13, the source electrode 9 and the source area 7 are in contact across the entire surface of the semiconductor substrate in the cell area, including the first gate areas 4 in the trenches, but not on the side walls of the trenches 3.

Furthermore, the present invention is not limited to a structure in which the source electrode 9 and source area 7 are in contact across the entire surface of the semiconductor substrate in the cell area, and another structure is possible, in which the area of contact between the source electrode 9 and the source area 7 cover only a part of the substrate surface. In other words, a structure is possible in which the insides of the trenches 3 in the structure of the first embodiment are completely filled with the first gate areas 4. This structure would also prevent failures caused by steps on the substrate surface.

Third Embodiment

Figure 14:
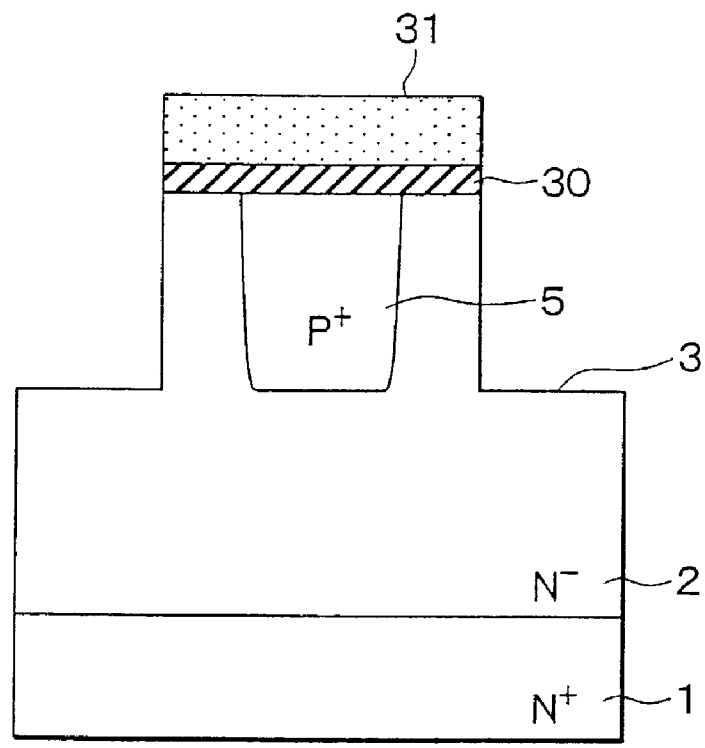
FIG. 14 is a cross-sectional view of the silicon carbide semiconductor device of a third embodiment of the present invention.
Figure 15:
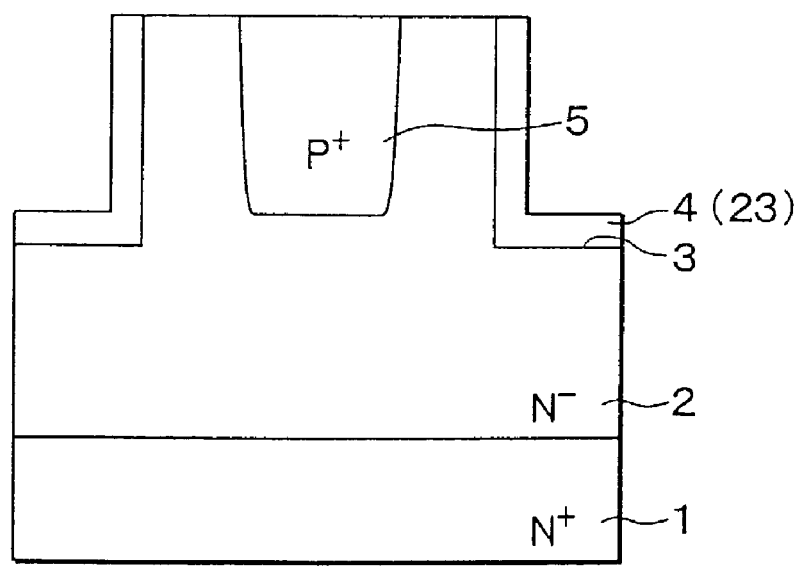
FIG. 15 is a cross-sectional view of the silicon carbide semiconductor device of the third embodiment of the present invention.

In the present embodiment, the silicon carbide semiconductor device of the first embodiment, shown in FIG. 1 through FIG. 4, is manufactured by an alternate method of manufacturing. FIGS. 14 and 15 show manufacturing stages of the silicon carbide semiconductor device. Because the manufacturing method of this embodiment is almost identical to that of the first embodiment, only the parts that are different from the first embodiment are shown in FIGS. 14 and 15.

Firstly, as shown in FIG. 14, the second gate area 5 is formed at the surface of the $n^-$-type drift layer 2. While the polysilicon film 20 and the LTO 21 were used as masks in the first embodiment, a single mask may be used instead.

Next, a carbon resist film 30 (first mask material) and an LTO film 31 (second mask material) are deposited one after the other on the surface of the $n^-$-type drift layer 2, including over the second gate area 5. After the LTO film 31 is patterned by photolithography, the carbon resist 30 is patterned using the LTO film 31 as a mask. Then RIE is performed using the LTO film 31 as a mask to form the trenches 3 at the surface of the $n^-$-type drift layer 2.

Then, the LTO film 31 is stripped off, and an epitaxial growth is formed using the carbon resist 30 as a mask. Because the epitaxial growth would not take place at the area covered by the carbon resist 30, a $p^+$-type layer is selectively deposited only on the inner walls of the trenches 3 to form the first gate areas 4.

In the process shown in FIG. 15, the carbon resist 30 is stripped off. The resulting process would be similar to the first embodiment through the steps shown in FIG. 8. Then, the steps shown in FIG. 9 and the subsequent steps are followed to complete the silicon carbide semiconductor device shown in FIG. 1 through FIG. 4.

Therefore, the first gate areas 4 are formed inside the trenches 3 through a selective epitaxial growth only inside the trenches 3.

Fourth Embodiment

Figure 16:
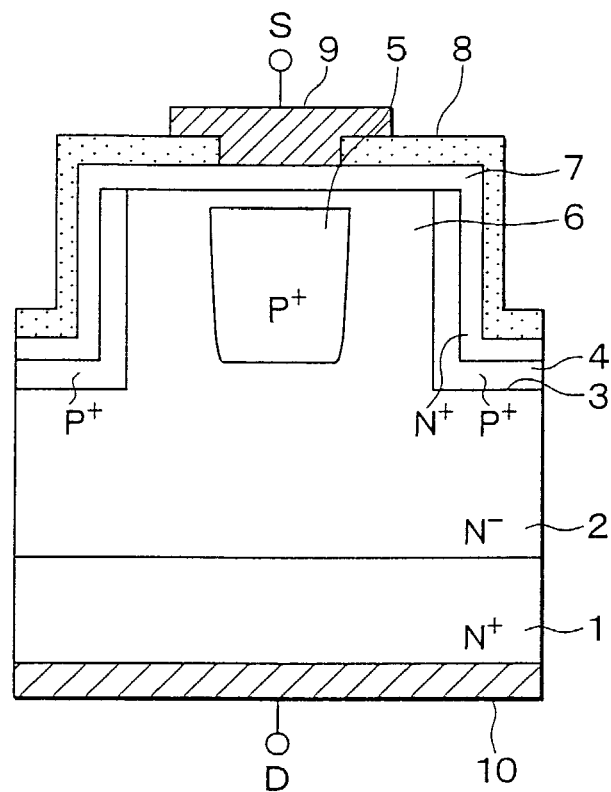
FIG. 16 is a cross-sectional view of the silicon carbide semiconductor device of a fourth embodiment of the present invention.

FIG. 16 shows a cross-section of a silicon carbide semiconductor device, having J-FETs, of the fourth embodiment of the present invention. A structure of the silicon carbide semiconductor device of the present embodiment will be described by referring to FIG. 16. Because the basic structure is similar to the first embodiment, only the parts that are different from the first embodiment will be described.

As shown in FIG. 16, the second gate area 5 is embedded below the surface of the $n^-$-type drift layer 2, and a part of the $n^-$-type drift layer 2 remains on top of the second gate area 5. In other words, a part of the $n^-$-type drift layer 2 is sandwiched between the $n^+$-type source area 7 and the second gate area 5.

Such a silicon carbide semiconductor device may be formed by adjusting the energy level for ion implanting during the steps shown in FIG. 5 in the first embodiment, so that the second gate area 5 would be formed below the surface of the $n^-$-type drift layer 2.

Because the second gate area 5, formed by ion implanting, and the $n^+$-type source area 7 are not in contact in this structure, and the pn junction, which may be susceptible to crystal defects caused by ion implanting, would no longer be formed between two areas of high impurity concentration levels, which are the $n^+$-type source area 7 and the second gate area 5. As a result, a potential for hole injection from the second gate area 5 into the $n^+$-type source area 7, through the crystal defects, is eliminated. Recovery characteristics would be improved, leakage would be reduced or suppressed, and the silicon carbide semiconductor device would become more resistant to voltage stress.

Fifth Embodiment

Figure 17:
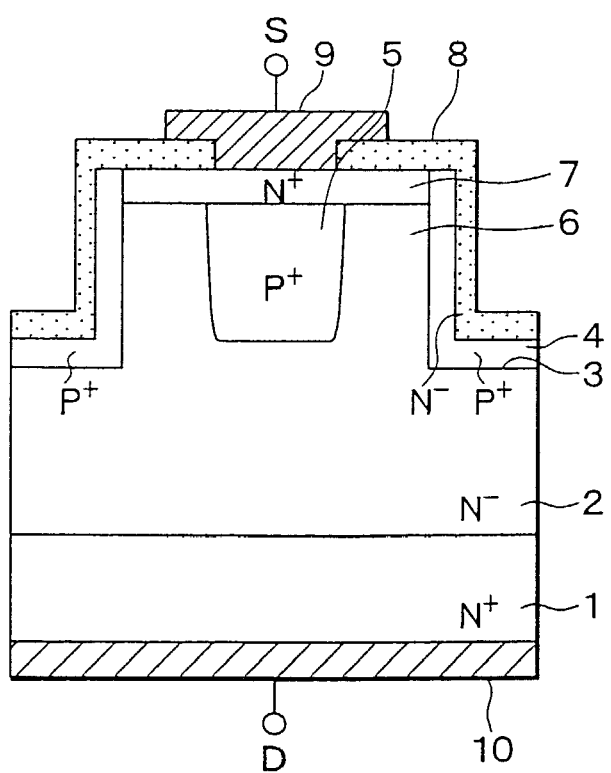
FIG. 17 is a cross-sectional view of the silicon carbide semiconductor device of a fifth embodiment of the present invention.

FIG. 17 shows a cross-section of a silicon carbide semiconductor device, having J-FETs, of the fifth embodiment of the present invention. A structure of the silicon carbide semiconductor device of the present embodiment will be described by referring to FIG. 17. Because the structure is similar to the first embodiment, only the parts that are different from the first embodiment will be discussed.

As shown in FIG. 17, the $n^+$-type source area 7 is formed by ion implanting the surface of the $n^-$-type drift layer 2 between the first gate areas 4 with $n^-$-type impurities for example, N or P in the present embodiment.

A method of manufacturing such a silicon carbide semiconductor device will be explained by referring to the manufacturing steps shown in FIGS. 18 and 19. Because the manufacturing process is similar to that of the first embodiment, only the parts that are different from the first embodiment will be mentioned.

Figure 18:
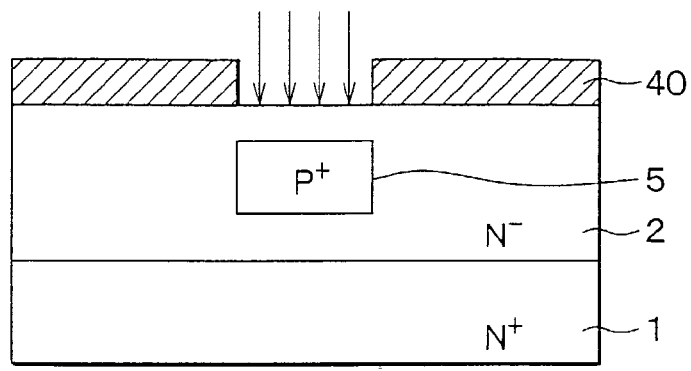
FIG. 18 is a diagram showing a manufacturing stage of the silicon carbide semiconductor device in FIG. 17.

Firstly, the $n^-$-type drift layer 2 is formed at the top surface of the $n^+$-type substrate 1 in the steps shown in FIG. 18. While the thickness and doping concentration level of the $n^-$-type drift layer 2 should be determined by the level of resistance to a voltage stress required in the design, the impurity concentration level should preferably be $5E14/cm^3$ to $1E16/cm^3$, and the thickness should preferably be 8 to 50 microns. For example, in order for the device to withstand a 1,000 volt stress, the drift layer 2 should have an impurity concentration level of $1E16/cm^3$ and a thickness of 10 microns. Then an LTO film 40 is deposited on the surface of the $n^-$-type drift layer 2. After an opening corresponding to the second gate area 5 is made in the LTO film 40 by photolithography, an ion implanting step with p-type impurities is performed using the LTO film 40 as a mask to form the second gate area 5 inside the $n^-$-type drift layer 2.

Figure 19:
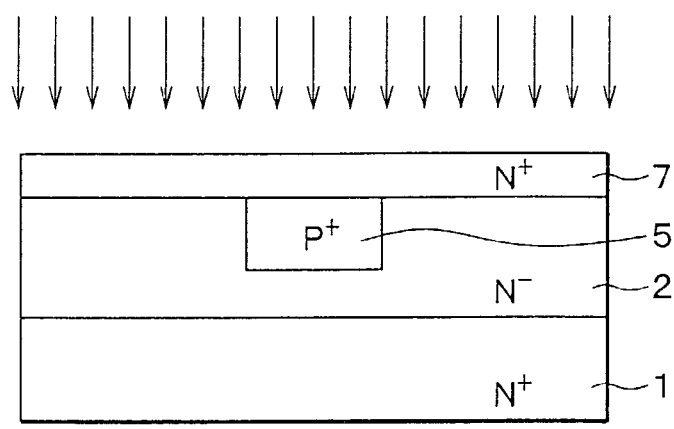
FIG. 19 is a diagram showing a manufacturing stage of the silicon carbide semiconductor device in FIG. 17.

The subsequent steps are not illustrated in FIGS. 18 and 19. After the steps for forming the trenches 3, as shown in FIG. 6, the first gate area 5 is formed, as shown in FIGS. 7 and 8, and the interlayer insulating film 8, the source electrode 9, and the gate electrodes 12 are formed. Finally, the drain electrode 10 is formed to complete the silicon carbide semiconductor device.

As thus shown, it is possible to form the $n^+$-type source area 7 by ion implanting. Even with this approach, the effects similar to the first embodiment are achieved, because the channel areas 6 between the first and second gate areas 4, 5 are formed with the $n^-$-type drift area 2. Of course the $n^+$-type source area 7 may also be formed by an epitaxial growth in the steps shown in FIGS. 18 and 19.

Sixth Embodiment

Figure 20:
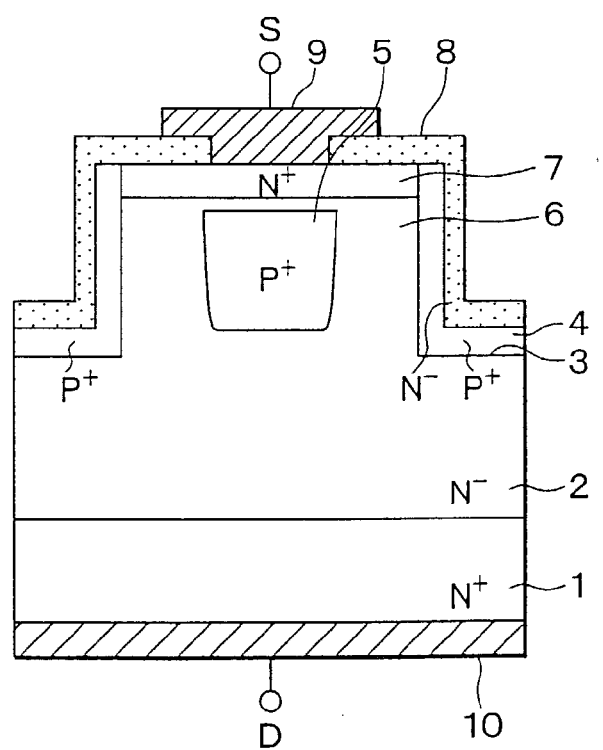
FIG. 20 is a cross-sectional view of the silicon carbide semiconductor device of a sixth embodiment of the present invention.

FIG. 20 shows a cross-section of a silicon carbide semiconductor device having J-FETs of the sixth embodiment of the present invention. Similar to the fourth embodiment, the device structure of the present embodiment has a part of the $n^-$-type drift layer 2 sandwiched between the $n^+$-type source area 7 and the second gate area 5 as in the structure shown in the fifth embodiment. Such a structure is possible by adjusting the energy level for the ion implanting step in the step shown in FIG. 18 to make the top part of the second gate area 5 deeper than in the fifth embodiment. Therefore, it is possible to apply the structure shown in the fourth embodiment on the silicon carbide semiconductor device shown in the fifth embodiment. As a result, the effect similar to the fifth embodiment is obtained, as well as the effect similar to the fourth embodiment.

Seventh Embodiment

Figure 21:
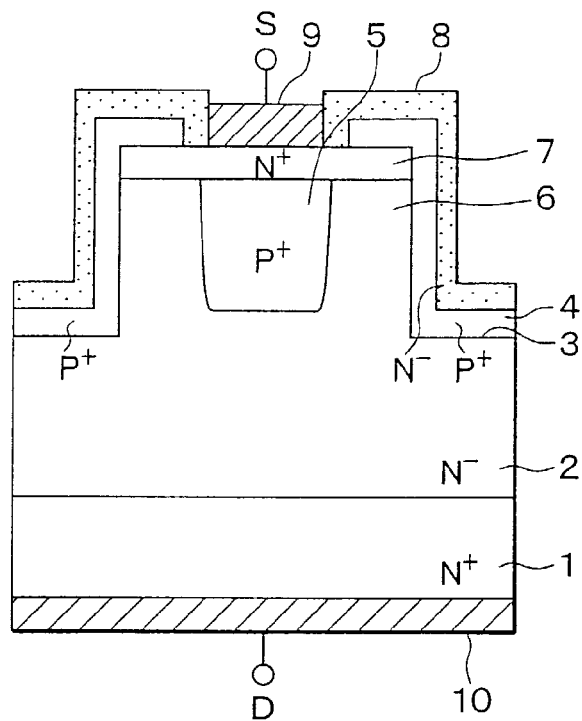
FIG. 21 shows a cross-sectional view of the silicon carbide semiconductor device of a seventh embodiment of the present invention.

FIG. 21 shows a cross-section of a silicon carbide semiconductor device having J-FETs of the seventh embodiment of the present invention. In the present embodiment, the n$^+$-type source area 7 is exposed by etching a prescribed area of the first gate areas 4 in the silicon carbide semiconductor device of the fifth embodiment, instead of planarizing the first gate areas 4 by CMP. Such a structure is realized by stripping the prescribed area of the first gate areas 4 by photo etching after the first gate areas 4 are formed by the epitaxial growth, as in the fifth embodiment.

Therefore, it is possible to obtain a contact between the n$^+$-type source area 7 and the source electrode 9, without planarizing the first gate areas 4, in order to achieve the effects similar to the fifth embodiment.

Eighth Embodiment

Figure 22:
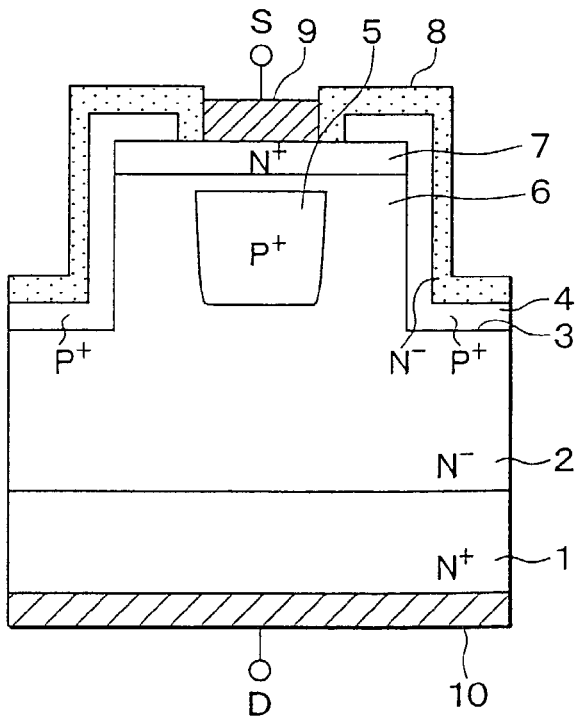
FIG. 22 is a cross-sectional view of the silicon carbide semiconductor device of an eighth embodiment of the present invention.

FIG. 22 shows a cross-section of the silicon carbide semiconductor device having J-FETs of the eighth embodiment of the present invention. Similar to the fourth embodiment described earlier, the structure of the present embodiment has a part of the n$^-$-type drift layer 2 sandwiched between the n$^+$-type source area 7 and the second gate area 5 in the structure shown in the sixth embodiment. Such a structure is realized by adjusting the energy level for the ion implanting step for forming the second gate area 5, so that the top part of the second gate area 5 would be deeper than in the seventh embodiment. As a result, effects similar to the fourth embodiment are achieved with the silicon carbide semiconductor device of the seventh embodiment. Effects similar to the sixth embodiment are achieved, as well as effects similar to the fourth embodiment.

Ninth Embodiment

Figure 23:
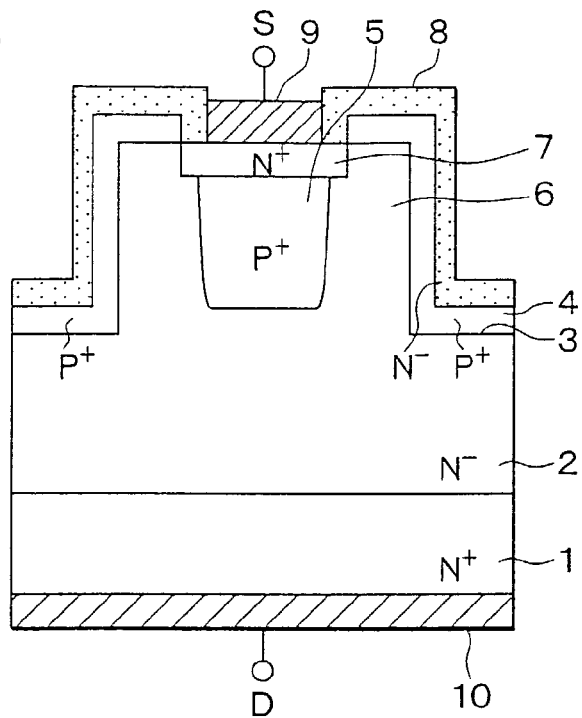
FIG. 23 is a cross-sectional view of the silicon carbide semiconductor device of a ninth embodiment of the present invention.

FIG. 23 shows a cross-section of a silicon carbide semiconductor device having J-FETs of the ninth embodiment of the present invention. In the present embodiment, the n$^+$-type source area 7 is formed by ion implanting after the first gate areas 4 are formed. In other words, after the steps shown in FIGS. 5, 6 and 7 for the first embodiment are performed, a prescribed area of the first gate areas 4 is stripped by photo etching, and the same mask is also used for ion implanting n-type impurities to form the n$^+$-type source area 7.

Therefore, the n$^+$-type source area 7 may be formed by ion implanting after the first gate areas 4 are formed. As a result, effects that are similar to the first embodiment are achieved.

Tenth Embodiment

Figure 24:
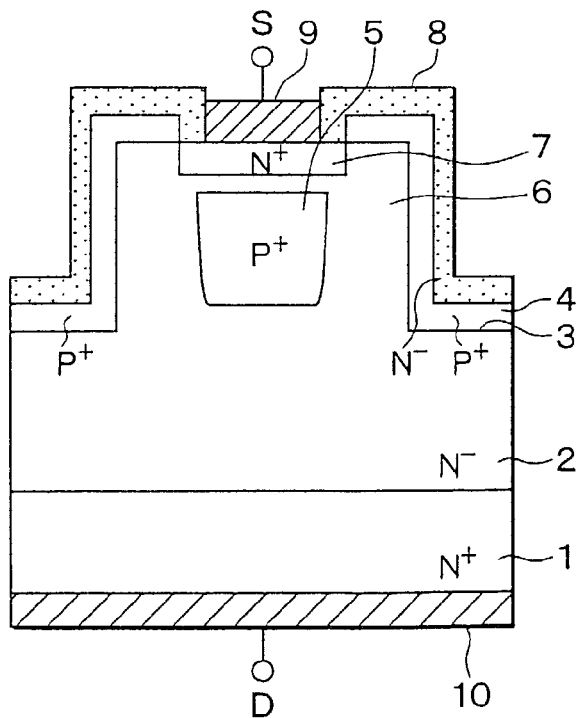
FIG. 24 is a cross-sectional view of the silicon carbide semiconductor device of a tenth embodiment of the present invention.

FIG. 24 shows a cross-section of a silicon carbide semiconductor device having J-FETs of the tenth embodiment of the present invention. The present embodiment is similar to the fourth embodiment in that a part of the n$^-$-type drift layer 2 is sandwiched between the n$^+$-type source area 7 and the second gate area 5 in the structure shown in the eighth embodiment. Such a structure may be realized by adjusting the energy level of the ion implanting step for forming the second gate area 5, so that the top part of the second gate area 5 would be deeper than in the ninth embodiment. As a result, effects that are similar to the fourth embodiment are achieved with the silicon carbide semiconductor device shown in the ninth embodiment. Effects that are similar to the eighth embodiment are achieved, as well as effects that are similar to the fourth embodiment.

Eleventh Embodiment

Figure 25:
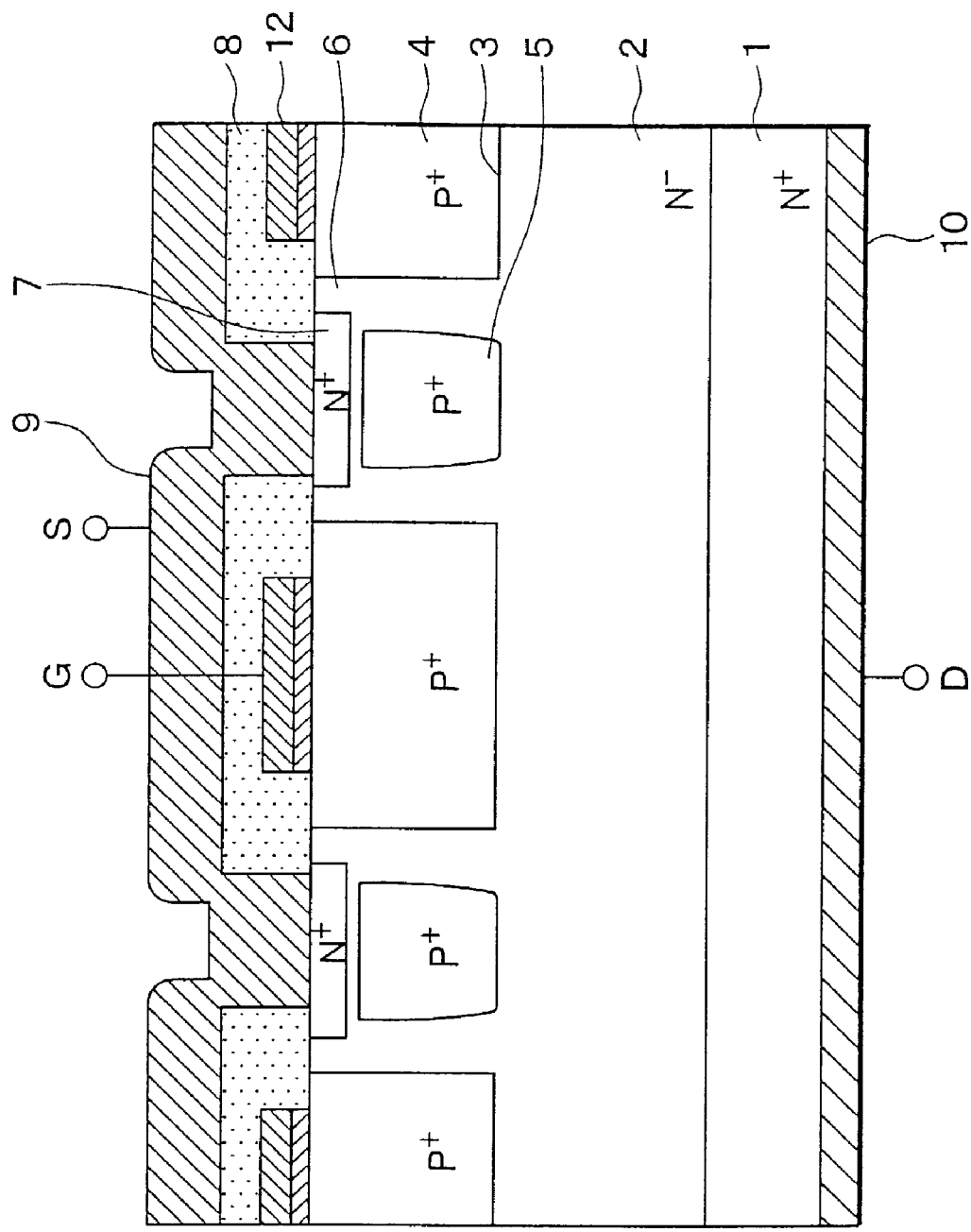
FIG. 25 is a cross-sectional view of the silicon carbide semiconductor device of an eleventh embodiment of the present invention.

FIG. 25 shows a cross section of the silicon carbide semiconductor device, which includes J-FETS, of the eleventh embodiment of the present invention. The structure of the silicon carbide semiconductor device will be described by referring to FIG. 25. Because the basic structure is similar to the fifth embodiment, only the parts that are different from the fourth embodiment will be discussed.

In the present embodiment, the trenches 3 are filled with the first gate areas 4, and the gate electrodes 12 are formed on top of the first gate areas 4 with a metallic layer consisting of Ti or Al, which are capable of creating Ohmic contact with a p-type layer, and another layer, consisting of Ni, on top of the Ti or Al layer.

A method of manufacturing such a silicon carbide semiconductor device is described by referring to FIGS. 26–29.

Figure 26:
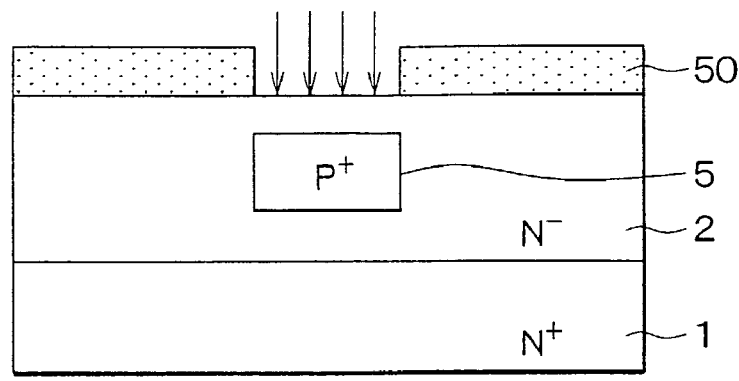
FIGS. 26–29 are cross-sectional diagrams showing stages of a manufacturing process for the silicon carbide semiconductor device in FIG. 25.

In the steps shown in FIG. 26, an n$^-$-type drift layer 2 is formed on the top surface of the n$^+$-type substrate 1. Then an LTO film 50 is deposited on the surface of the n-type drift layer 2. An opening corresponding to the second gate area 5 is made in the LTO film 50 by photolithography. Using the LTO film 50 as a mask, an ion implanting step is performed with p-type impurities to form the second gate area 5 inside the n$^-$-type drift layer 2.

Figure 27:
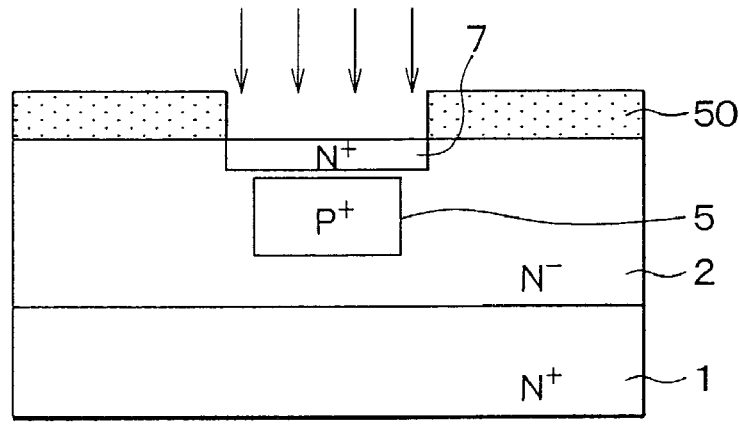

In the steps shown in FIG. 27, the opening in the LTO film 50 is widened by photo etching. Then, using the LTO film 50 as a mask, an ion implanting step is performed with n-type impurities to form the n$^+$-type source area 7 at the surface of the n$^-$-type drift layer 2. There should preferably be a wide spacing between the n$^+$-type source area 7 and the second gate area 5.

Figure 28:
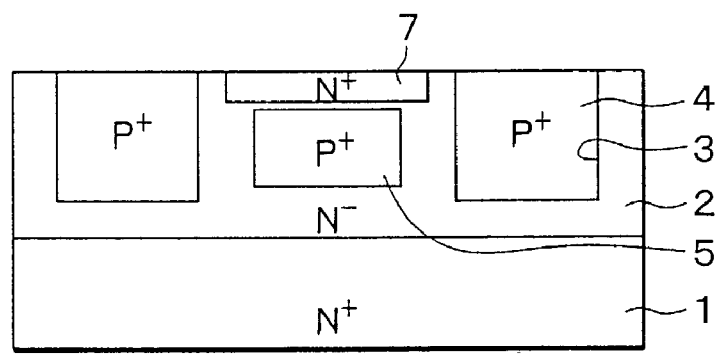

In the steps shown in FIG. 28, the LTO film 50 is first stripped off, and another LTO film is deposited. Openings corresponding to the trenches 3 are made in the LTO film. Using the LTO film as a mask, trenches 3, having depths similar to the second gate area 5, are formed at the surface of the n$^-$-type drift layer 2. After the LTO film is stripped off, a p$^+$-type layer is grown epitaxially to completely fill the trenches 3. The p$^+$-type layer is planarized by CMP to expose the n$^+$-type source area 7. The first gate areas 4 are formed using the p$^+$-type layer in these steps.

Figure 29:
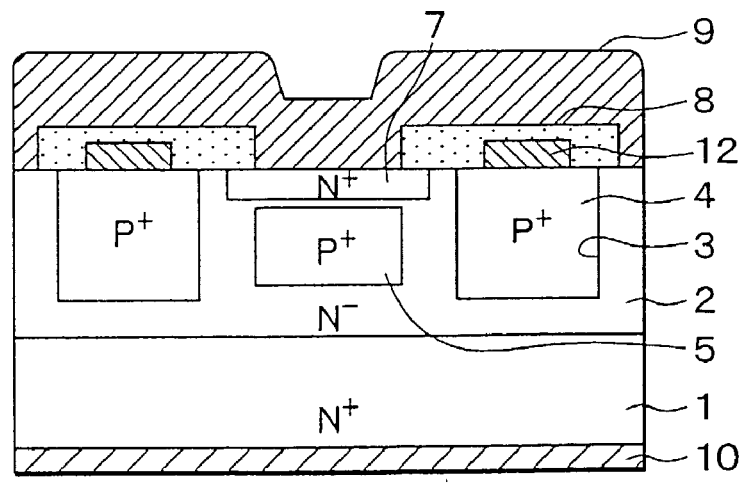

In the steps shown in FIG. 29, the metallic layers are deposited, and the metallic layers are patterned to form the gate electrodes 12. Then, the interlayer insulating film 8 is deposited on the substrate surface, contact holes are formed in the interlayer insulating film 8, and the source electrode 9 is formed on the interlayer insulating film 8. Then, the drain electrode 10 is formed on the backside of the n$^+$-type substrate 1, followed by a sintering step to complete the silicon carbide semiconductor device of the present embodiment shown in FIG. 21.

As described thus far, a structure having the trenches 3 completely filled by the first gate areas 4 is possible. This structure yields effects that are similar to the first embodiment.

In a structure in which the trenches 3 are not completely filled by the first gate areas 4, steps would remain on the surface of the semiconductor substrate, leading to bonding failures, as the electrodes are wire bonded for external contacts. In the present embodiment, on the other hand, the trenches 3 are completely filled with the first gate areas 4 to planarize the entire surface of the semiconductor substrate. As a result, wire bonding can be completed more successfully.

Twelfth Embodiment

Figure 30:
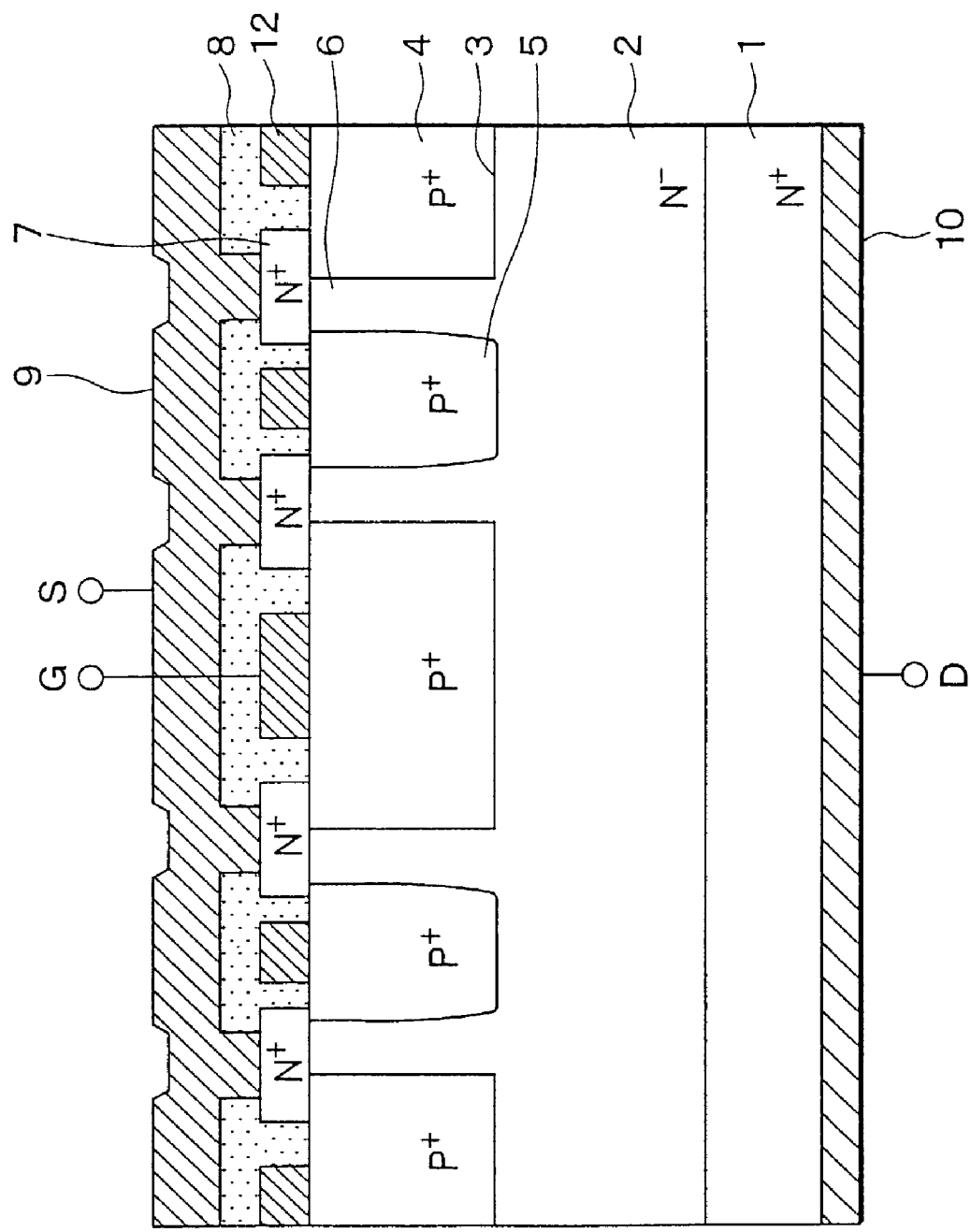
FIG. 30 is a cross-sectional view of the silicon carbide semiconductor device of a twelfth embodiment of the present invention.

FIG. 30 shows a cross-section of a silicon carbide semiconductor device having J-FETs of the twelfth embodiment of the present invention. In the present embodiment, the second gate area 5 in the device structure in the eleventh embodiment is formed at the surface of the n⁻-type drift layer 2, and the n⁺-type source area 7 is formed on top of the n⁻-type drift layer 2.

Figure 31:
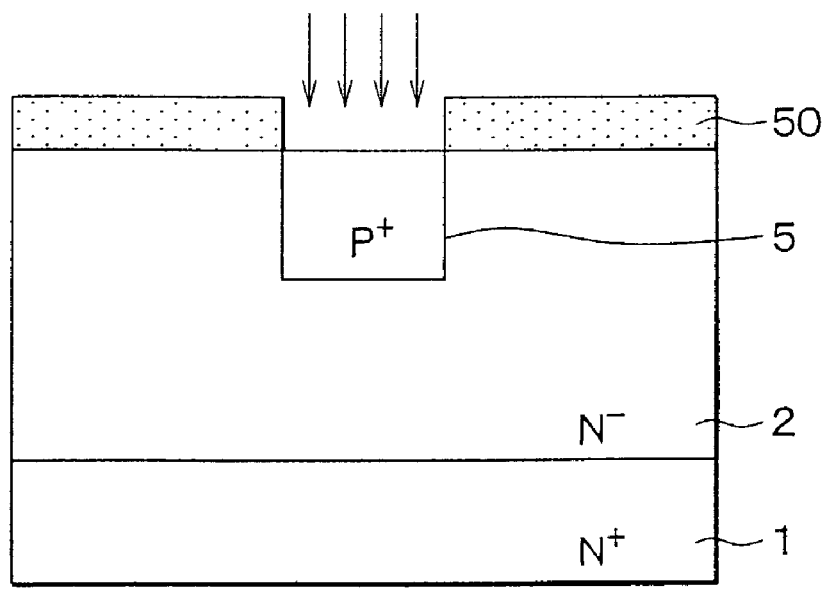
FIG. 31 is a cross-sectional view showing a manufacturing stage of the silicon carbide semiconductor device in FIG. 30.

A method of manufacturing such a silicon carbide semiconductor device is described by referring to FIG. 31. Because this manufacturing process is basically similar to the eleventh embodiment, the manufacturing process will be described by referring to the eleventh embodiment.

In the steps shown in FIG. 31, steps similar to FIG. 26 for the eleventh embodiment are performed to form the second gate area 5 at the surface of the n⁻-type drift layer 2. The second gate area 5 terminates at the surface of the n⁻-type drift layer 2.

Figure 32:
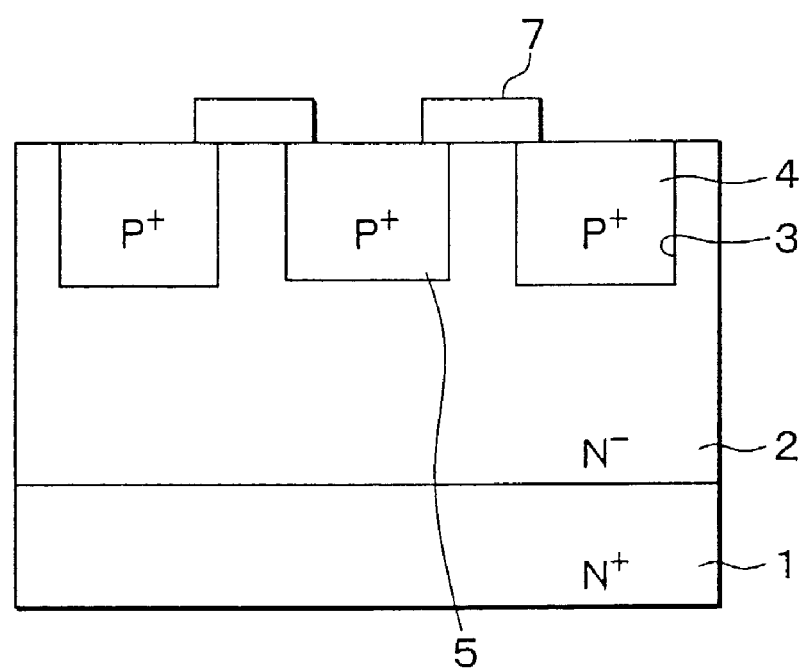
FIG. 32 is a cross-sectional view showing a manufacturing stage of the silicon carbide semiconductor device in FIG. 30.
Figure 33:
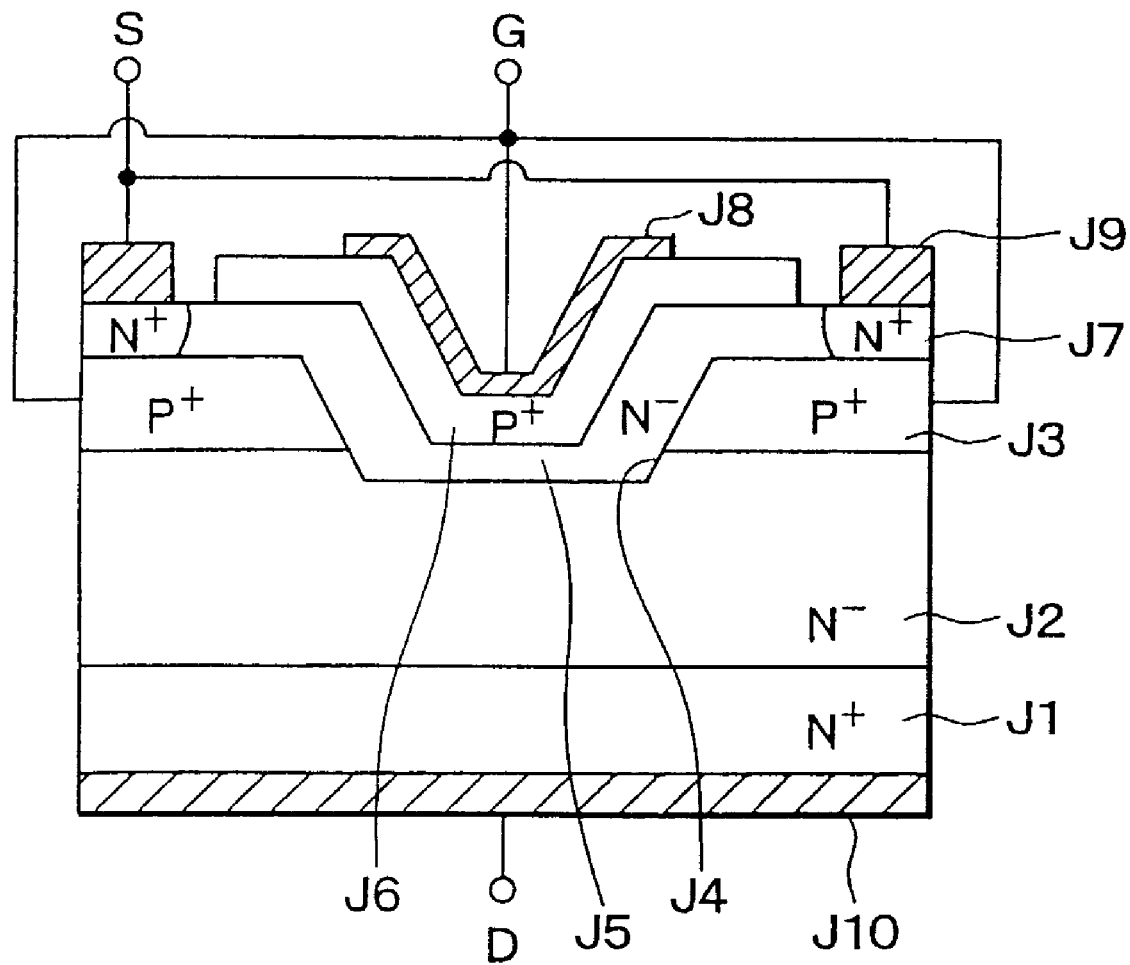
FIG. 33 is a cross-sectional diagram showing a first example of a prior silicon carbide semiconductor device.

In the steps shown in FIG. 32, steps that are similar to FIG. 28 for the eleventh embodiment take place to form the trenches 3 and the first gate areas. Then, an n⁺-type layer, having an impurity concentration level of $1E18/cm^3$ to $5E19/cm^3$, is deposited on the substrate surface, and the n⁺-type layer is patterned by photo etching to form the n⁺-type source area 7. Then, steps similar to those in FIG. 29 in the eleventh embodiment are performed to complete the silicon carbide semiconductor device shown in FIG. 30.

Therefore, a structure is possible in which the second gate area 5 is formed at the surface of the n⁻-type drift layer 2, and the n⁺-type source area 7 is formed on top of the n⁻-type drift layer 2. Such a structure yields effects that are similar to the first embodiment.

Other Embodiments

In the various embodiments described above, parts of the n⁻-type drift layer 2 become the channel areas 6 in the silicon carbide semiconductor devices having n-channel J-FETs. The present invention also applies to silicon carbide semiconductor devices having p-channel J-FETs, so that the conductivity types of the various parts of the silicon carbide semiconductor devices would be reversed.

Furthermore, the embodiments described above mention the double-gate driven J-FETs, in which the first gate electrodes, electrically connected to the first gate areas 4, and the second gate electrodes, electrically connected to the second gate areas 5, are driven by the common gate electrode 12. However, the present invention also applies to a silicon carbide semiconductor device having a double-gate driven J-FET, the first gate electrodes and the second gate electrode of which are separate.

Furthermore, the present invention also applies to a silicon carbide semiconductor device having a single-gate driven J-FET, in which only one of the first gate areas 4 or the second gate area 5 is used for driving the device, and the other is connected to, for example, the source electrode 9, so that this gate area would not be used for driving the device.

The invention claimed is:

1. A silicon carbide semiconductor device that includes J-FETS, the device comprising:
   a semiconductor substrate that includes a substrate of a first conductivity type, which comprises silicon carbide and a drift layer of the first conductivity type, wherein the drift layer is comprised of epitaxially grown silicon carbide having a lower impurity concentration level than the substrate of the first conductivity type, wherein the drift layer is located on the substrate of the first conductivity type;
   a drain electrode formed on a backside of the substrate;
   a cell area, which is an area of the semiconductor substrate where the J-FETs are formed; and
   a peripheral area around the cell area, wherein the cell area comprises:
   trenches formed at the surface of the drift layer;
   first gate areas of a second conductivity type formed on inner walls of the trenches;
   a second gate area of the second conductivity type, wherein the second gate area has almost the same depth as the trenches and is formed in isolation from the trenches at the surface of the drift layer and in isolation from the first gate areas;
   a source area of the first conductivity type formed only in the cell area, wherein the source area has a higher impurity concentration level than the drift layer and is located on top of channel areas, wherein the channel areas are located between the first and second gate areas in the drift layer;
   a source electrode formed only in the cell area, wherein the source electrode is electrically connected to the source area; and
   the peripheral area comprises:
   trenches
   first gate areas;
   second gate area;
   first gate electrodes formed only in the peripheral area and electrically connected to the first gate areas; and
   a second gate electrode formed only in the peripheral area and electrically connected to the second gate area, wherein the device has a normally-off state in which substantially no current flows in the channel areas when substantially no voltage bias is applied to the first and second gate electrodes.

2. A silicon carbide semiconductor device comprising:
   a semiconductor substrate that includes a substrate of a first conductivity type, which comprises silicon carbide and a drift layer of the first conductivity type, wherein the drift layer is comprised of epitaxially grown silicon carbide having a lower impurity concentration level than the substrate of the first conductivity type, wherein the drift layer is located on the substrate of the first conductivity type;
   a drain electrode formed on a backside of the substrate;
   a cell area, which is an area of the semiconductor substrate where the J-FETs are formed;
   a peripheral area surrounding the cell area; wherein the cell area comprises:
   a multitude of trenches formed in isolation from each other at the surface of the drift layer;
   a multitude of first gate areas of a second conductivity type formed in isolation from each other by being placed on inner walls of the multitude of trenches;
   a second gate area of the second conductivity type having almost the same depth as the first gate areas and formed in isolation from the first gate areas at an area between the multitude of first gate areas at the surface of the drift layer;
   a source area of the first conductivity type formed only in the cell area and having a higher impurity concentration level than the drift layer and formed on top of channel areas, wherein the channel areas are areas in the drift layer that are sandwiched between the first and second gate areas;
   a source electrode formed only in the cell area and electrically connected to the source area; and
   the peripheral area comprises:
   trenches;
   first gate areas;
   a second gate area;

first gate electrodes formed only in the peripheral area and electrically connected to the first gate areas; and second gate electrode formed only in the peripheral area and electrically connected to the second gate area, wherein the device has a normally-off state in which substantially no current flows in the channel areas when substantially no voltage bias is applied to the first and second gate electrodes.

3. The silicon carbide semiconductor device of claim 1, wherein the source area and the source electrode are formed in the cell area on the surface of the semiconductor substrate over an area spanning from the top of the channel areas to the side walls of the trenches or across the entire surface of the semiconductor substrate, and the source electrode and the source area are in contact with each other throughout the area spanning from the top of the channel areas to the side walls of the trenches or across the entire surface of the semiconductor substrate.

4. The silicon carbide semiconductor device of claim 1, wherein the silicon carbide semiconductor device includes an area of the second conductivity type that connects between the first and second gate areas on top of the drift layer that is between the first and second gate areas in the peripheral area, and a gate electrode, which is a common electrode for the first and second gate electrodes, is formed on the surface of the area of the second conductivity type.

5. A method of manufacturing a silicon carbide semiconductor device, having a semiconductor substrate that includes a substrate of a first conductivity type consisting of silicon carbide and a drift layer of the first conductivity type consisting of silicon carbide with a lower impurity concentration level than the substrate and formed by an epitaxial growth on the substrate; a drain electrode formed on the backside of the substrate; a cell area, which is an area of the semiconductor substrate where the J-FETs are formed; and a peripheral area surrounding the cell area, wherein the device includes a normally-off state in which substantially no current flows when substantially no voltage bias is applied to first and second gate electrodes, and wherein the method comprises:

forming a multitude of trenches in isolation from each other at the surface of the drift layer to form the cell area in the area in which the cell area is to be formed;

forming a multitude of first gate areas of a second conductivity type in isolation from each other on inner walls of the multitude of trenches;

forming a second gate area of the second conductivity type having almost the same depth as the first gate areas in isolation from the first gate areas at an area between the multitude of first gate areas at the surface of the drift layer;

forming a source area of the first conductivity type, having a higher impurity concentration level than the drift layer on top of channel areas wherein the channel areas are areas that are sandwiched between the first and second gate areas in the drift layer, and only in the area where the cell area is to be formed;

forming a source electrode electrically connected to the source area only in the area where the cell area is to be formed;

forming the trenches, the first gate areas, and the second gate area in an area in which the peripheral area is to be formed during steps for forming the peripheral area; and forming the first gate electrodes, electrically connected to the first gate areas, and the second gate electrode, electrically connected to the second gate area, only in the area in which the peripheral area is to be formed.

6. The method of manufacturing the silicon carbide semiconductor device of claim 5, wherein the source area and the source electrode are formed in such a way that the source area and the source electrode would be connected to each other across the entire surface of the semiconductor substrate or across an area spanning between the top of the channel areas and the side walls of the trenches in the area where the cell area is to be formed in the step for forming the source area and the source electrode.

7. The method of manufacturing the silicon carbide semiconductor device of claim 5, wherein:

in the steps for forming the first gate areas and the second gate area, the first and second gate areas are connected by an area of the second conductivity type, after the first gate areas and the second gate area are formed; and in the step for forming the first gate electrodes and the second gate electrode, a gate electrode that is common to both the first and second gate electrodes is formed on the surface of the area of the second conductivity type.

8. A method of manufacturing a silicon carbide semiconductor device having J-FETs on a semiconductor substrate, having a substrate of a first conductivity type consisting of silicon carbide and a drift layer of the first conductivity type consisting of silicon carbide with a lower impurity concentration level than the substrate and formed on the substrate, wherein the device includes a normally-off state in which substantially no current flows when substantially no voltage bias is applied to first and second gate electrodes, and wherein the method comprises:

forming a multitude of trenches in isolation from each other at the surface of the drift layer;

forming a multitude of first gate areas of a second conductivity type in isolation from each other on inner walls of the multitude of trenches;

forming a second gate area of the second conductivity type having almost the same depth as the first gate areas in isolation from the first gate areas in an area between the first gate areas at the surface of the drift layer;

forming a source area of the first conductivity type having a higher impurity concentration level than the drift layer on top of channel areas, wherein the channel areas are areas that are sandwiched between the first and second gate areas in the drift layer;

forming the first gate electrodes that are electrically connected to the first gate areas;

forming the second gate electrode that is electrically connected to the second gate area;

forming a source electrode that is electrically connected to the source area;

forming a drain electrode on a backside of the substrate, wherein the step for forming the second gate area and the step for forming the trenches comprise:

making openings in a first mask material at areas corresponding to the second gate area and the trenches, after the first mask material is placed on the surface of the drift layer;

covering the openings corresponding to the trenches in the first mask material by placing a second mask material on top of the drift layer, as well as the first mask material, and patterning the second mask material;

stripping off the second mask material after forming the second gate area at the surface of the drift layer by ion implanting using the first and second mask materials as a mask;

covering the opening corresponding to the second gate area in the first mask material by first placing a third mask material on top of the drift layer, as well as the first mask material, and by patterning the third mask material; and stripping off the third mask, after the trenches are formed at the surface of the drift layer by performing an etching step using the first and third mask materials as a mask.

9. A method of manufacturing a silicon carbide semiconductor device having J-FETs on a semiconductor substrate, having a substrate of a first conductivity type consisting of silicon carbide and a drift layer of the first conductivity type consisting of silicon carbide with a lower impurity concentration level than the substrate and formed on the substrate, wherein the device includes a normally-off state in which substantially no current flows when substantially no voltage bias is applied to first and second gate electrodes, and wherein the method comprises:

forming a multitude of trenches in isolation from each other at the surface of the drift layer;

forming a multitude of first gate areas of a second conductivity type in isolation from each other on inner walls of the multitude of trenches;

forming a second gate area of the second conductivity type having almost the same dept as the first gate areas in isolation from the first gate areas in an area between the first gate areas at the surface of the drift layer;

forming a source area of the first conductivity type having a higher impurity concentration level than the drift layer on top of channel areas, wherein the channel areas are areas that are sandwiched between the first and second gate areas in the drift layer;

forming the first gate electrodes that are electrically connected to the first gate areas;

forming the second gate electrode that is electrically connected to the second gate area;

forming a source electrode that is electrically connected to the source area;

forming a drain electrode on a backside of the substrate, wherein the steps for forming the second gate area and the trenches comprise:

making openings corresponding to the second gate area and the trenches in the first mask material, after placing the first mask material on the surface of the drift layer;

covering the openings corresponding to the trenches in the first mask material by first placing a second mask material on top of the drift layer, as well as the first mask layer, and then patterning the second mask material;

removing the second mask material after forming a french for the second gate area in an area designated for the second gate area at the surface of the drift layer using an etching process with the first and second mask materials as a mask;

covering an opening corresponding to the second gate area in the first mask material by first placing a third mask material on top of the first mask material on the drift layer, as well as inside the trench for forming the second gate area, and then patterning the third mask material;

stripping off the third mask material after forming the trenches at the surface of the drift layer with an etching process using the first and third mask materials as a mask; and forming the second gate area by an epitaxial growth method inside the trench for forming the second gate area.

10. A method of manufacturing a silicon carbide semiconductor device having J-FETs on a semiconductor substrate, having a substrate of a first conductivity type consisting of silicon carbide and a drift layer of the first conductivity type consisting of silicon carbide with a lower impurity concentration level than the substrate and formed on the substrate, wherein the device includes a normally-off state in which substantially no current flows when substantially no voltage bias is applied to first and second gate electrodes, and wherein the method comprises:

forming a multitude of trenches in isolation from each other at the surface of the drift layer;

forming a multitude of first gate areas of a second conductivity type in isolation from each other on inner walls of the multitude of trenches;

forming a second gate area of the second conductivity type having almost the same depth as the first gate areas in isolation from the first gate areas in an area between the first gate areas at the surface of the drift layer;

forming a source area of the first conductivity type having a higher impurity concentration level than the drift layer on top of channel areas, wherein the channel areas are areas that are sandwiched between the first and second gate areas in the drift layer;

forming the first gate electrodes that are electrically connected to the first gate areas;

forming the second gate electrode that is electrically connected to the second gate area;

forming a source electrode that is electrically connected to the source area;

forming a drain electrode on a backside of the substrate, wherein, in the steps for forming the trenches and the first gate areas, the method of manufacturing comprises:

making openings corresponding to the trenches in the first and second mask materials, after placing the first mask material and the second mask material, in that order, on the drift layer;

forming the trenches at the surface of the drift layer by etching using the second mask material as a mask; and forming the first gate areas by a selective epitaxial growth of the semiconductor layer of the second conductivity type in the trenches using the first mask material as a mask, after stripping off the second mask material.

11. The method of manufacturing the silicon carbide semiconductor device of claim 10, wherein the trenches are completely filled by the first gate areas in the step for forming the first gate areas.

12. A silicon carbide device comprising:

a cell area in which a plurality of J-FETs are formed and a peripheral area surrounding the cell area;

a semiconductor substrate that includes a substrate of a first conductivity type comprised of silicon carbide and a drift layer of the first conductivity type, wherein the drift layer is comprised of epitaxially grown silicon carbide having a lower impurity concentration level than the substrate of the first conductivity type, wherein the drift layer is located on the substrate of the first conductivity type;

a plurality of trenches formed in the surface of the drift layer;

a first gate areas of a second conductivity type, wherein the first gate areas are formed on inner walls of the trenches;

a second gate area of the second conductivity type having almost the same depth as the trenches, wherein the second gate area is formed in isolation from the first gate areas at the surface of the drift layer in an area different from where the trenches are formed;

a source area of the first conductivity type having a higher impurity concentration level than the drift layer and formed on channel areas, wherein the channel areas are located between the first and second gate areas in the drift layer;

a gate electrode electrically connected to the first and second gate areas, wherein first and second gate electrodes are disposed only in the peripheral area;

a source electrode electrically connected to the source area; and a drain electrode formed on a backside of the substrate, wherein the first and second gate electrodes ensure a normally-off state in which substantially no current flows in the channel areas when substantially no voltage bias is applied to the first and second gate electrodes.

* * * * *